United States Patent [19]

Van Engelen et al.

[11] Patent Number: 5,953,105
[45] Date of Patent: *Sep. 14, 1999

[54] POSITIONING DEVICE WITH A REFERENCE FRAME FOR A MEASURING SYSTEM, AND A LITHOGRAPHIC DEVICE PROVIDED WITH SUCH A POSITIONING DEVICE

[75] Inventors: Gerard Van Engelen, Veldhoven; Frank B. Sperling, Nuenen; Henricus W. A. Janssen, Eindhoven; Adianus G. Bouwer, Nuenen; Cornelis D. Van Dijk, Boxtel; Johannes M. M. Van Kimmenade, Eil; Jan Van Eijk; Adrianus Van Der Pal, both of Eindhoven, all of Netherlands

[73] Assignee: U.S. Philips Corporation, New York, N.Y.

[ * ] Notice: This patent is subject to a terminal disclaimer.

[21] Appl. No.: 08/776,418
[22] PCT Filed: Apr. 29, 1996
[86] PCT No.: PCT/IB96/00383
 § 371 Date: Jan. 30, 1997
 § 102(e) Date: Jan. 30, 1997
[87] PCT Pub. No.: WO96/38765
 PCT Pub. Date: Dec. 5, 1996

[30] Foreign Application Priority Data

May 30, 1995 [EP] European Pat. Off. .............. 95201409
Mar. 4, 1996 [EP] European Pat. Off. .............. 96200575

[51] Int. Cl.[6] ........................... G03B 27/42; G03B 27/58; G03B 27/62
[52] U.S. Cl. ................................. 355/53; 355/72; 355/75
[58] Field of Search .................................. 355/35, 72, 53, 355/75, 30

[56] References Cited

U.S. PATENT DOCUMENTS 5,610,686 3/1997 Osanai ....................................... 355/72
5,796,469 8/1998 Ebinuma ................................... 355/53
5,844,666 12/1998 Van Engelen et al. .................... 355/53

Primary Examiner—Safet Mefjahic
Assistant Examiner—Peter B. Kim
Attorney, Agent, or Firm—F. Brice Faller

[57] ABSTRACT

A lithographic device comprising a mask table (5), a projection system (3), a substrate table (1) which is displaceable relative to the projection system (3) by means of a drive unit (21), and a measuring system (39) for measuring a position of the substrate table (1) relative to the projection system (3). A stationary part (157) of the drive unit (21) is fastened to a machine frame (85) of the lithographic device, while a stationary part (51, 53, 55) of the measuring system (39) is fastened to a reference frame (89) of the lithographic device which is dynamically isolated from the machine frame (85) by means of dynamic isolators (95). This prevents vibrations caused in the machine frame (85) by reaction forces of the drive unit (21) from being transmitted to the reference frame (89), so that the accuracy of the measuring system (39) is not adversely affected by such vibrations. The mask table (5) is displaceable relative to the projection system (3) by means of a further drive unit (31) having a stationary part (119) fastened to the machine frame (85), and the measuring system comprises a further stationary part (71, 73, 75) for measuring a position of the mask table (5) relative to the projection system (3), said further stationary part (71, 73, 75) being fastened to the reference frame (89).

11 Claims, 11 Drawing Sheets

POSITIONING DEVICE WITH A REFERENCE FRAME FOR A MEASURING SYSTEM, AND A LITHOGRAPHIC DEVICE PROVIDED WITH SUCH A POSITIONING DEVICE

BACKGROUND OF THE INVENTION

The invention relates to a positioning device comprising an object table, a sub-system for processing an object to be placed on the object table, a drive unit for displacing the object table relative to the sub-system, and a measuring system for measuring a position of the object table relative to the sub-system. The drive unit comprising a stationary part which is fastened to a machine frame of the positioning device, while the measuring system comprises a stationary part and a movable part which is fastened to the object table for cooperation with the stationary part of the measuring system.

The invention further relates to a lithographic device comprising a radiation source, a mask table, a projection system having a main axis, a substrate table, a drive unit for displacing the substrate table relative to the projection system in at least one direction perpendicular to the main axis, and a measuring system for measuring a position of the substrate table relative to the projection system. The drive unit includes a stationary part which is fastened to a machine frame of the lithographic device, while the measuring system comprises a stationary part and a movable part which is fastened to the substrate table for cooperation with the stationary part of the measuring system.

EP-B-0 250 031, to which U.S. Pat. No. 4,737,823 corresponds, discloses a lithographic device of the kind mentioned in the opening paragraphs which comprises a positioning device of the kind mentioned in the opening paragraphs. The object table of the known positioning device corresponds to the substrate table of the known lithographic device, while the sub-system of the known positioning device corresponds to a sub-system comprising the projection system, the mask table, and the radiation source of the known lithographic device. The known lithographic device is used in the manufacture of integrated semiconductor circuits by means of an optical lithographic process. The radiation source of the known lithographic device is a light source, while the projection system is an optical lens system by means of which a partial pattern of an integrated semiconductor circuit, which pattern is present on a mask to be placed on the mask table of the lithographic device, is imaged on a reduced scale on a semiconductor substrate to be placed on the substrate table of the lithographic device. Such a semiconductor substrate comprises a large number of fields on which identical semiconductor circuits are to be provided. The individual fields of the semiconductor substrate are consecutively exposed for this purpose, the semiconductor substrate being in a constant position relative to the mask and the projection system during the exposure of an individual field, while between two consecutive exposure steps a next field of the semiconductor substrate is brought into position relative to the focusing system by means of the drive unit of the lithographic device. This process is repeated a number of times, each time with a different mask with a different partial pattern, so that integrated semiconductor circuits of comparatively complicated structures can be manufactured. The structures of such integrated semiconductor circuits have detail dimensions which lie in the sub-micron range. The partial patterns present on the consecutive masks should accordingly be imaged on said fields of the semiconductor substrate with an accuracy relative to one another which lies in the sub-micron range. The semiconductor substrate should accordingly be positioned relative to the mask and the projection system by means of the drive unit with an accuracy also in the sub-micron range. To obtain such a high positioning accuracy, the position of the substrate table relative to the projection system must be measured by the measuring system of the lithographic device with a corresponding accuracy. For this purpose, the measuring system of the known lithographic device comprises a laser interferometer system. The movable part of the laser interferometer system comprises a mirror which is fastened to the substrate table, while the stationary part of the laser interferometer system comprises a laser interferometer which is fastened to a glass plate which is secured to four vertical columns of the machine frame of the known lithographic device.

A disadvantage of the known lithographic device and the known positioning device applied therein is that the accuracy of the measuring system is adversely affected by mechanical vibrations and deformations of the machine frame. Since the stationary part of the drive unit is fastened to the machine frame, such vibrations and deformations particularly arise under the influence of reaction forces exerted on the stationary part of the drive unit, which reaction forces arise from driving forces exerted by the drive unit on the substrate table. As a result of these vibrations and deformations, the position of the stationary part of the measuring system relative to the projection system is not precisely defined. In particular, the vibrations of the machine frame are comparatively strong when the reaction forces have a frequency which is comparable to a natural frequency which is characteristic of a usual machine frame such as used in the known lithographic device and positioning device. Under such circumstances, the reaction forces will cause the machine frame to resonate, whereby comparatively strong mechanical vibrations arise in the machine frame and in the glass plate carrying the stationary part of the measuring system, even if the reaction forces exerted on the stationary part of the drive unit are comparatively small.

SUMMARY OF THE INVENTION

According to the invention, the stationary part of the measuring system is fastened to a reference frame of the positioning device or the lithographic device which is dynamically isolated from the machine frame.

Since the reference frame is dynamically isolated from the machine frame, the mechanical vibrations caused in the machine frame by the reaction forces of the drive unit are not transmitted into the reference frame, so that the reference frame and the stationary part of the measuring system fastened to the reference frame remain free from mechanical vibrations caused by said reaction forces. It is prevented thereby that the reference frame is brought into resonance by comparatively high-frequency components of said reaction forces, so that the stationary part of the measuring system has a precisely defined reference position relative to the sub-system and the object table of the positioning device or relative to the projection system and the substrate table of the lithographic device. In this way, the accuracy with which the position of the object table or substrate table can be measured relative to the sub-system or projection system, respectively, is not adversely affected by inaccuracies of the position of the stationary part of the measuring system arising from said mechanical vibrations.

A particular embodiment of a positioning device according to the invention is characterized in that the object table is displaceable over a guide parallel to at least an X-direction, the guide being fastened to the reference frame.

A particular embodiment of a lithographic device according to the invention is characterized in that the substrate table is displaceable over a guide which extends perpendicularly to the main axis and is fastened to the reference frame.

If the driving force exerted by the drive unit of the positioning device or lithographic device on the object table or substrate table, respectively, is directed substantially parallel to the guide, and if substantially no mechanical friction is present between the guide and the object table or substrate table, the driving force is purely used for accelerating or decelerating the object table or substrate table, and no reaction force arising from said driving force is exerted by the object table or substrate table on the guide. It is noted that substantially no mechanical friction is present between the guide and the object table or substrate table when the object table or substrate table is guided along the guide by means of, for example, a static fluid bearing. Since in this particular embodiments of the positioning device and lithographic device the guide is fastened to the reference frame, no mechanical vibrations or deformations are caused in the guide as a result of the reaction forces of the drive unit. The fact that the guide remains free from mechanical vibrations caused by said reaction forces implies not only that the positioning accuracy and the time required for positioning are improved owing to the absence of mechanical vibrations in the guide carrying the object table or substrate table, but also that the required time is further reduced because comparatively high frequencies of the driving force of the drive unit are admissible during positioning of the object table or substrate table.

A special embodiment of a positioning device according to the invention is characterized in that the positioning device is provided with a force actuator system which is controlled by an electric control unit and which exerts a compensation force on the reference frame during operation, which compensation force has a mechanical moment about a reference point of the reference frame having a value equal to a value of a mechanical moment of a force of gravity acting on the object table about said reference point, and a direction which is opposed to a direction of the mechanical moment of said force of gravity.

A special embodiment of a lithographic device according to the invention is characterized in that the lithographic device is provided with a force actuator system which is controlled by an electric control unit and which exerts a compensation force on the reference frame during operation, which compensation force has a mechanical moment about a reference point of the reference frame having a value equal to a value of a mechanical moment of a force of gravity acting on the substrate table about said reference point, and a direction which is opposed to a direction of the mechanical moment of said force of gravity.

The object table of the positioning device and the substrate table of the lithographic device rest on the guide fastened to the reference frame, whereby the object table and substrate table exert a support force on the guide and the reference frame which is determined by the force of gravity acting on the object table and substrate table, respectively. When the object table or substrate table is displaced, a point of application of said support force on the guide is also displaced relative to the reference frame. The use of said force actuator system prevents the reference frame from vibrating or shaking as a result of comparatively great or quick displacements of the object table or substrate table and said point of application relative to the reference frame. The control unit controls the compensation force of the force actuator system as a function of the position of the object table or substrate table relative to the reference frame. Owing to said compensation force, the displaceable object table or substrate table has a so-called virtual centre of gravity which has a constant position relative to the reference frame. In this special embodiments of the positioning device and lithographic device, therefore, the reference frame and the measuring system are not only free from mechanical vibrations and deformations caused by reaction forces of the drive unit, but also remain free from mechanical vibrations and deformations caused by displacements of the actual centre of gravity of the object table and substrate table, respectively, relative to the reference frame. The positioning accuracy of the positioning device and lithographic device and the time required for a displacement of the object table and substrate table, respectively, into a desired end position are further improved in this manner.

A further embodiment of a lithographic device according to the invention is characterized in that the lithographic device comprises a further drive unit for displacing the mask table relative to the projection system in a scanning direction perpendicular to the main axis, the further drive unit comprising a stationary part which is fastened to the machine frame, while the substrate table is displaceable relative to the projection system parallel to at least the scanning direction, the measuring system comprising a further stationary part which is fastened to the reference frame and a further movable part which is fastened to the mask table for cooperation with the further stationary part of the measuring system for measuring a position of the mask table relative to the projection system or for measuring a position of the mask table relative to the substrate table. In this further embodiment of a lithographic device in accordance with the invention, the semiconductor substrate under manufacture is not in a constant position relative to the mask and the projection system during the exposure of a single field of the semiconductor substrate, but instead the semiconductor substrate and the mask are synchronously displaced relative to the projection system parallel to the scanning direction by means of the drive unit and the further drive unit, respectively, during exposure. In this manner the pattern present on the mask is scanned parallel to the scanning direction and synchronously imaged on the semiconductor substrate. It is achieved thereby that a maximum surface area of the mask which can be imaged on the semiconductor substrate by means of the projection system is limited to a lesser degree by a size of an aperture of the projection system. Since the detail dimensions of the integrated semiconductor circuits to be manufactured lie in the sub-micron range, the semiconductor substrate and the mask should be displaced with an accuracy also in the sub-micron range relative to the projection system during the exposure. To reduce the time required for the manufacture of the semiconductor circuits, the semiconductor substrate and the mask should in addition be displaced and positioned relative to one another with a comparatively high speed during exposure. Since the pattern present on the mask is imaged on a reduced scale on the semiconductor substrate, the speed with which and the distance over which the mask is displaced are greater than the speed with which and the distance over which the semiconductor substrate is displaced, the ratio between said speeds and the ratio between said distances both being equal to a reduction factor of the projection system. Since in this further embodiment of the lithographic device both the stationary part of the measuring system cooperating with the movable part of the measuring system fastened to the substrate table, and the further stationary part of the measuring system cooperating with the further movable part of the measuring system fastened to the mask table, are fastened to the reference frame, both the stationary part and the further stationary part of the measuring system remain free from mechanical vibrations caused by the reaction forces of the drive unit of the substrate table and by the comparatively great reaction forces of the further drive unit of the mask table. In this way, the stationary part and the further stationary part of the measuring system have precisely defined positions relative to each other and precisely defined reference positions relative to the projection system, the substrate table and the mask table. It is achieved thereby that the accuracy with which the positions of the substrate table and the mask table can be measured relative to the projection system, or the accuracy with which the position of the mask table can be measured relative to the substrate table, is not adversely affected by inaccuracies of the positions of the stationary part and the further stationary part of the measuring system.

It is noted that a lithographic device with a displaceable substrate table, a displaceable mask table, and a laser interferometer system for measuring a position of the substrate table and a position of the mask table relative to the projection system, is known from U.S. Pat. No. 5,194,893. However, U.S. Pat. No. 5,194,893 does not disclose how the stationary parts of the laser interferometer system are fastened to the frame of the known lithographic device.

A still further embodiment of a lithographic device according to the invention is characterized in that the mask table is displaceable over a first guide extending parallel to the scanning direction and the substrate table is displaceable over a second guide extending perpendicularly to the main axis, the first guide and the second guide being fastened to the reference frame. If the driving forces exerted by the drive unit and the further drive unit on the substrate table and the mask table are directed substantially parallel to the first and second guides, respectively, and if substantially no mechanical friction is present between the first guide and the substrate table and between the second guide and the mask table, the driving forces are purely used for accelerating or decelerating the substrate table and mask table, and no reaction forces arising from said driving forces are exerted by the substrate table and the mask table on the first and second guides. It is noted that substantially no mechanical friction is present between the guides and the tables when the tables are guided along the guides by means of, for example, static fluid bearings. Since in this embodiment of the lithographic device the first and second guides are fastened to the reference frame, no mechanical vibrations or deformations are caused in the guides as a result of the reaction forces of the drive unit and the further drive unit. The fact that the guides remain free from mechanical vibrations caused by said reaction forces implies not only that the positioning accuracies of the substrate table and the mask table are improved owing to the absence of mechanical vibrations in the guides, but also that the positioning accuracies are further improved and that the scanning velocities of the tables are increased because comparatively high frequencies and high values of the driving forces of the drive unit and the further drive unit are admissible during the scanning movements of the substrate table and the mask table.

A particular embodiment of a lithographic device according to the invention is characterized in that the lithographic device is provided with a force actuator system which is controlled by an electric control unit and which exerts a compensation force on the reference frame during operation, which compensation force has a mechanical moment about a reference point of the reference frame of a value which is equal to a value of a sum of a mechanical moment of a force of gravity acting on the substrate table about said reference point and a mechanical moment of a force of gravity acting on the mask table about said reference point, and a direction which is opposed to a direction of said sum of mechanical moments. The substrate table and the mask table rest on the first guide and the second guide, respectively, fastened to the reference frame, whereby the substrate table and the mask table exert a support force on the first guide and the second guide, respectively, which is determined by the forces of gravity acting on the substrate table and the mask table. When the substrate table and the mask table are displaced, a point of application of said support forces on the guides is also displaced relative to the reference frame. The use of said force actuator system prevents the reference frame from vibrating or shaking as a result of comparatively great or quick displacements of the substrate table and the mask table relative to the reference frame. The control unit controls the compensation force of the force actuator system as a function of the position of the substrate table and the position of the mask table relative to the reference frame. Owing to said compensation force, the displaceable substrate table and mask table have so-called virtual centres of gravity which have a constant position relative to the reference frame. In this particular embodiment of the lithographic device, therefore, the reference frame and the measuring system are not only free from mechanical vibrations and deformations caused by reaction forces of the drive unit and the further drive unit, but also remain free from mechanical vibrations and deformations caused by displacements of the actual centres of gravity of the substrate table mask table relative to the reference frame. The positioning accuracies of the drive units are further improved in this manner.

A special embodiment of a positioning device according to the invention is characterized in that the sub-system is fastened to the reference frame.

A special embodiment of a lithographic device according to the invention is characterized in that the projection system is fastened to the reference frame.

In these special embodiments of the positioning device and the lithographic device, the sub-system and the projection system, respectively, and the reference frame carrying the stationary part or parts of the measuring system together constitute a stiff unit which remains free from mechanical vibrations and deformations arising from reaction forces of the drive unit or units. As a result, the position of the stationary part or parts of the measuring system relative to the sub-system and the projection system, respectively, is particularly well defined, so that the position of the object table and substrate table, respectively, and the mask table relative to the sub-system and the projection system, respectively, can be measured very accurately.

DETAILED DESCRIPTION OF THE PREFERRED EMBODIMENTS

Figure 1:
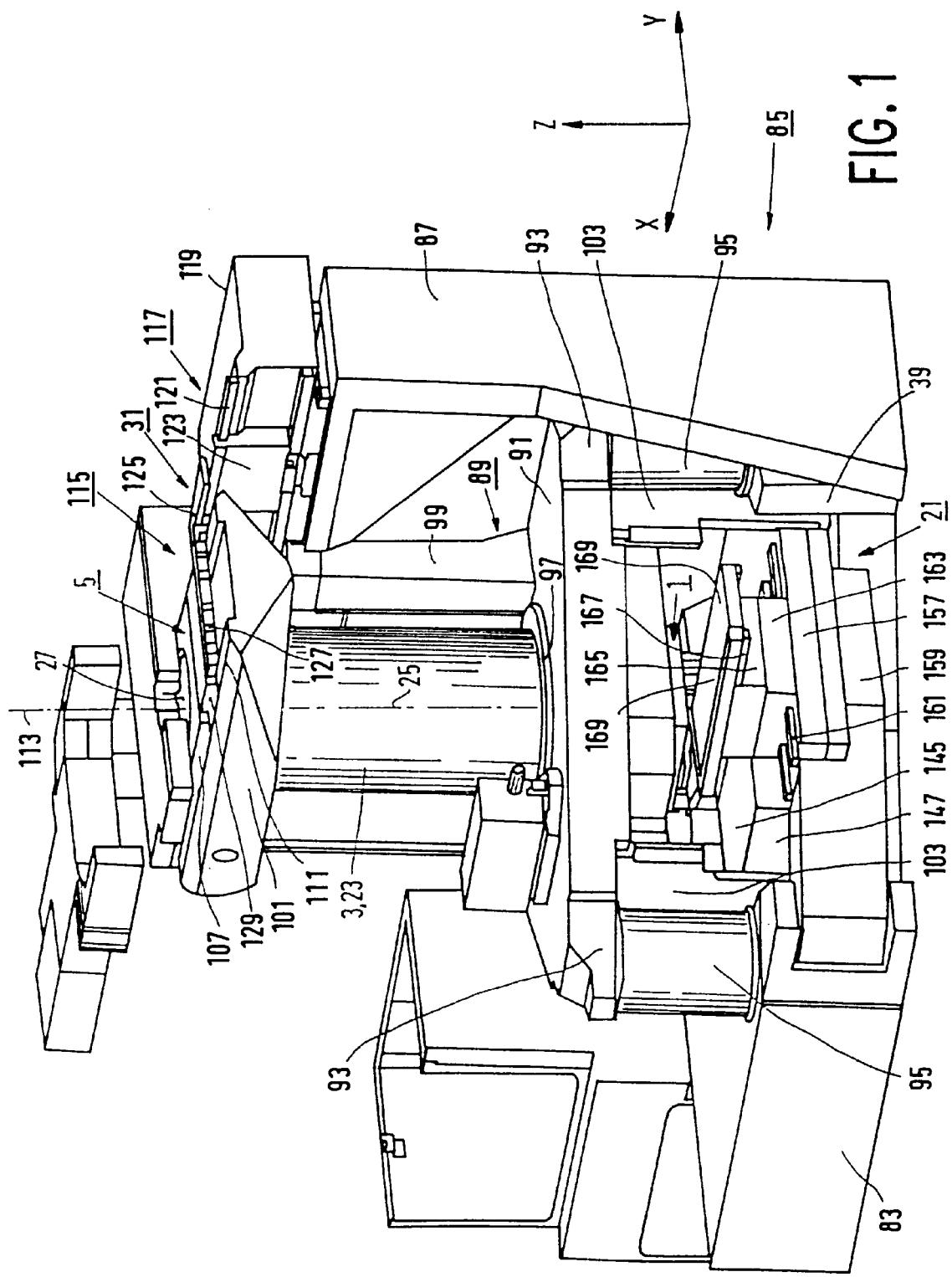
FIG. 1 shows a lithographic device according to the invention.
Figure 2:
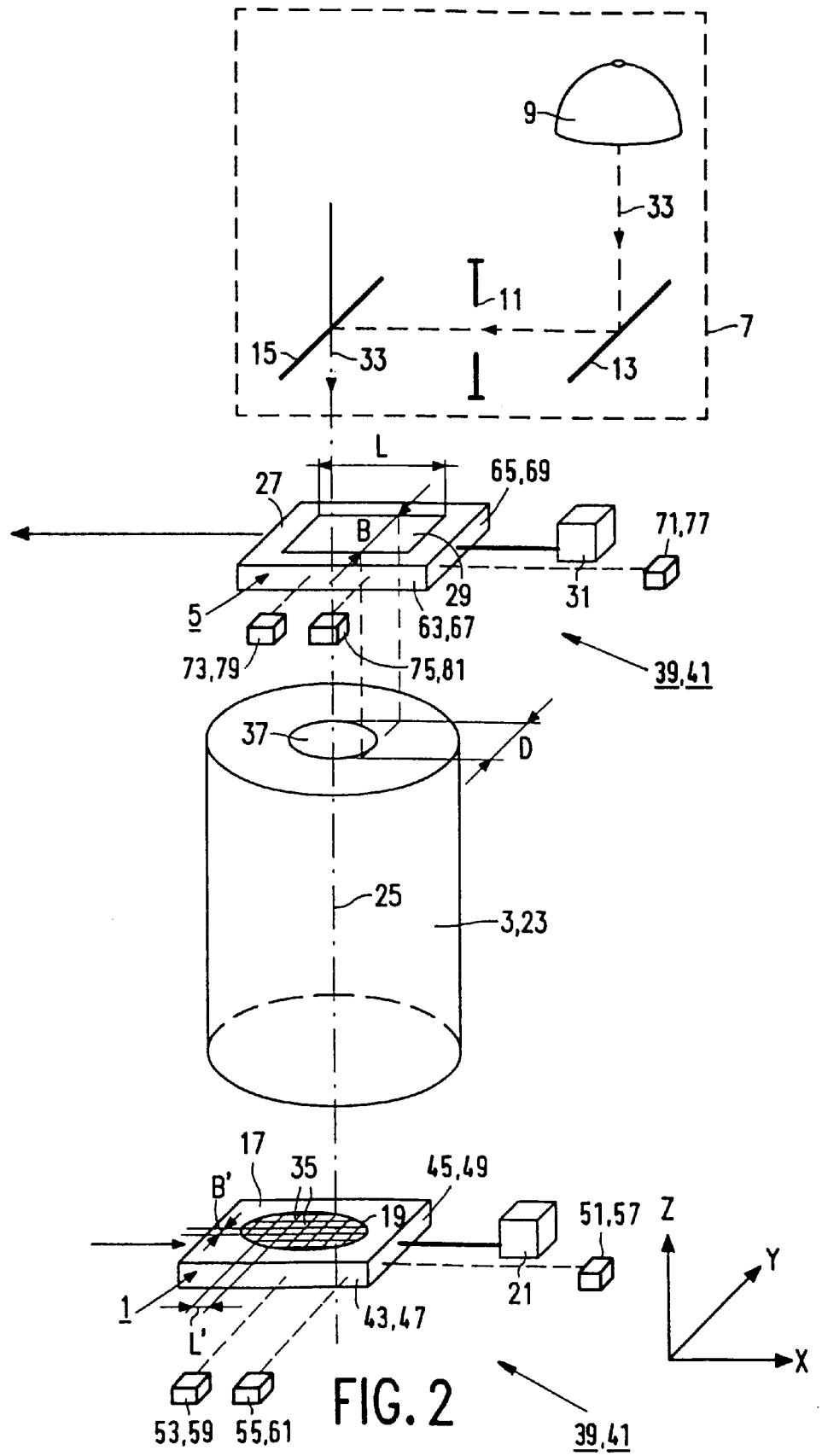
FIG. 2 is a diagram of the lithographic device of FIG. 1.
Figure 3:
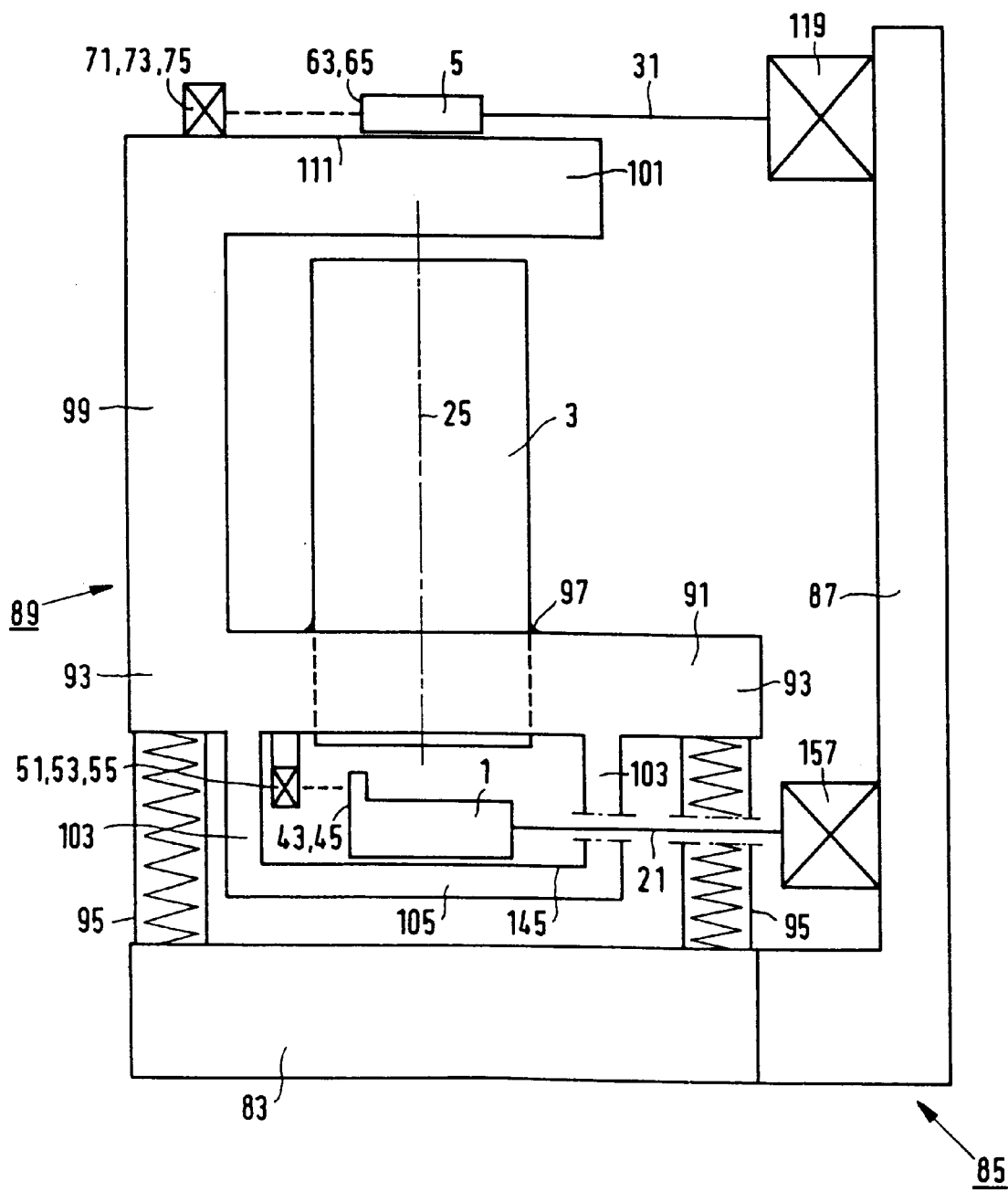
FIG. 3 is a diagram of a machine frame and a reference frame of the lithographic device of FIG. 1.

The lithographic device according to the invention shown in FIGS. 1, 2 and 3 is used for the manufacture of integrated semiconductor circuits by an optical lithographic process. As FIG. 2 shows diagrammatically, the lithographic device is consecutively provided, seen parallel to a vertical Z-direction, with a substrate table 1, a projection system 3, a mask table 5, and a radiation source 7. The lithographic device shown in FIGS. 1, 2 and 3 is an optical lithographic device in which the radiation source 7 comprises a light source 9, a diaphragm 11, and mirrors 13 and 15. The substrate table 1 comprises a support surface 17 which extends perpendicularly to the Z-direction and on which a semiconductor substrate 19 can be placed, while it is displaceable relative to the projection system 3 parallel to an X-direction perpendicular to the Z-direction and parallel to a Y-direction which is perpendicular to the X-direction and the Z-direction by means of a drive unit 21 of the lithographic device. The projection system 3 is an imaging system and comprises a system of optical lenses 23 with an optical main axis 25 which is parallel to the Z-direction and an optical reduction factor which is, for example, 4 or 5. The mask table 5 comprises a support surface 27 which is perpendicular to the Z-direction and on which a mask 29 can be placed, while it is displaceable parallel to the X-direction relative to the projection system 3 by means of a further drive unit 31 of the lithographic device. The mask 29 comprises a pattern or a partial pattern of an integrated semiconductor circuit. During operation, a light beam 33 originating from the light source 9 is passed through the mask 29 via the diaphragm 11 and the mirrors 13, 15 and is projected on the semiconductor substrate 19 by means of the projection system 3, so that the pattern present on the mask 29 is imaged on a reduced scale on the semiconductor substrate 19. The semiconductor substrate 19 comprises a large number of individual fields 35 on which identical semiconductor circuits are to be provided. For this purpose, the fields 35 of the semiconductor substrate 19 are consecutively exposed through the mask 29, a next field 35 being positioned relative to the projection system 3 each time after the exposure of an individual field 35 in that the substrate table 1 is moved parallel to the X-direction and/or the Y-direction by means of the drive unit 21. This process is repeated a number of times, each time with a different mask, so that comparatively complicated integrated semiconductor circuits with a layered structure are manufactured.

As FIG. 2 shows, the semiconductor substrate 19 and the mask 29 are synchronously displaced relative to the projection system 3 parallel to the X-direction, i.e. parallel to a scanning direction, by the drive units 21, 31 during the exposure of an individual field 35 of the semiconductor substrate 19. The pattern present on the mask 29 is thus scanned parallel to the scanning direction and synchronously imaged on the semiconductor substrate 19. In this way, as is clarified in FIG. 2, exclusively a maximum width B of the mask 29 directed parallel to the Y-direction which can be imaged on the semiconductor substrate 19 by the projection system 3 is limited by a diameter D of an aperture 37 of the projection system 3 diagrammatically depicted in FIG. 2. An admissible length L of the mask 29 which can be imaged on the semiconductor substrate 19 by the projection system 3 is greater than said diameter D. In this imaging method, which follows the socalled "step and scan" principle, a maximum surface area of the mask 29 which can be imaged on the semiconductor substrate 19 by the projection system 3 is limited by the diameter D of the aperture 37 of the projection system 3 to a lesser degree than in a conventional imaging method which follows the so-called "step and repeat" principle, which is used, for example, in a lithographic device known from EP-A-0 250 031, where the mask and the semiconductor substrate are in fixed positions relative to the projection system during exposure of the semiconductor substrate. Since the pattern present on the mask 29 is imaged on a reduced scale on the semiconductor substrate 19, said length L and width B of the mask 29 are greater than a corresponding length L' and width B' of the fields 35 on the semiconductor substrate 19, a ratio between the lengths L and L' and between the widths B and B' being equal to the optical reduction factor of the projection system 3. As a result also, a ratio between a distance over which the mask 29 is displaced during exposure and a distance over which the semiconductor substrate 19 is displaced during exposure, and a ratio between a speed with which the mask 29 is displaced during exposure and a speed with which the semiconductor substrate 19 is displaced during exposure are both equal to the optical reduction factor of the projection system 3. In the lithographic device shown in FIG. 2, the directions in which the semiconductor substrate 19 and the mask 29 are displaced during exposure are mutually opposed. It is noted that said directions may also be the same if the lithographic device comprises a different projection system by which the mask pattern is not imaged in reverse.

The integrated semiconductor circuits to be manufactured with the lithographic device have a structure with detail dimensions in the sub-micron range. Since the semiconductor substrate 19 is exposed consecutively through a number of different masks, the patterns present on the masks must be imaged on the semiconductor substrate 19 relative to one another with an accuracy which is also in the sub-micron range, or even in the nanometer range. During exposure of the semiconductor substrate 19, the semiconductor substrate 19 and the mask 29 should accordingly be displaced relative to the projection system 3 with such an accuracy, so that comparatively high requirements are imposed on the positioning accuracy of the drive units 21, 31.

As FIG. 2 shows diagrammatically, the lithographic device is provided with a measuring system 39 for measuring a position of the substrate table 1 relative to the projection system 3 and for measuring a position of the mask table 5 relative to the projection system 3. The measuring system 39 cooperates with a position control system of the lithographic device which is not shown in the Figures and controls the drive units 21, 31. The measuring system 39 comprises a laser interferometer system 41 which is usual and known per se and which is shown diagrammatically only in FIG. 2. The laser interferometer system 41 comprises movable parts 43 and 45 which are fastened to the substrate table 1, the movable part 43 comprising a first reflecting side wall 47 of the substrate table 1 extending perpendicular to the Y-direction, and the movable part 45 comprising a second reflecting side wall 49 of the substrate table 1 extending perpendicular to the X-direction. The laser interferometer system 41 further comprises stationary parts 51, 53 and 55 shown diagrammatically only in FIG. 2. The stationary part 51 comprises a laser interferometer 57 cooperating with the movable part 45 for measuring an X-position of the substrate table 1 relative to the projection system 3, while the stationary parts 53 and 55 comprise laser interferometers 59 and 61, respectively, cooperating with the movable part 43 for measuring a Y-position of the substrate table 1 relative to the projection system 3 and an angle of rotation θ of the substrate table 1 about an axis of rotation directed parallel to the Z-direction. As FIG. 2 further shows, the laser interferometer system 41 comprises further movable parts 63 and 65 which are fastened to the mask table 5, the further movable part 63 comprising a first reflecting side wall 67 of the mask table 5 extending perpendicular to the Y-direction, and the movable part 65 comprising a second reflecting side wall 69 of the mask table 5 extending perpendicular to the X-direction. The laser interferometer system 41 comprises further stationary parts 71, 73 and 75 shown diagrammatically only in FIG. 2. The further stationary part 71 comprises a laser interferometer 77 cooperating with the movable part 65 for measuring an X-position of the mask table 5 relative to the projection system 3, while the further stationary parts 73 and 75 comprise laser interferometers 79 and 81, respectively, cooperating with the movable part 63 for measuring a Y-position of the mask table 5 relative to the projection system 3 and an angle of rotation θ' of the mask table 5 about an axis of rotation directed parallel to the Z-direction.

As FIG. 1 and FIG. 3 show, the lithographic device has a base 83 which can be placed on a horizontal floor surface. The base 83 forms part of a machine frame 85 to which further a vertical, comparatively stiff metal column 87 belongs which is fastened to the base 83. The lithographic device further comprises a reference frame 89 with a triangular, comparatively stiff metal main plate 91 which extends transversely to the optical main axis 25 of the projection system 3 and is provided with a central light passage opening not visible in FIG. 1. The main plate 91 has three corner portions 93 with which it rests on three dynamic isolators 95 which are fastened on the base 83 and which will be described further below. Only two corner portions 93 of the main plate 91 and two dynamic isolators 95 are visible in FIGS. 1 and 3, while all three dynamic isolators 95 are visible in FIGS. 4 and 5. The projection system 3 is provided near a lower side with a mounting ring 97 by means of which the projection system 3 is fastened to the main plate 91. The reference frame 89 also comprises a vertical, comparatively stiff metal column 99 fastened on the main plate 91. Near an upper side of the projection system 3 there is furthermore a support member 101 for the mask table 5, which member also belongs to the reference frame 89, is fastened to the column 99 of the reference frame 89, and will be explained further below. Also belonging to the reference frame 89 are three vertical suspension plates 103 fastened to a lower side of the main plate 91 adjacent the three respective corner portions 93. Only two suspension plates 103 are partly visible in FIGS. 1 and 3, while all three suspension plates 103 are visible in FIGS. 4 and 5. As FIG. 5 shows, a horizontal support plate 105 for the substrate table 1 also belonging to the reference frame 89 is fastened to the three suspension plates 103. The support plate 105 is not visible in FIG. 1 and only partly visible in FIG. 4.

It is apparent from the above that the reference frame 89 supports the main components of the lithographic device, i.e. the substrate table 1, the projection system 3, and the mask table 5 parallel to the vertical Z-direction. As will be further explained below, the dynamic isolators 95 have a comparatively low mechanical stiffness. It is achieved thereby that mechanical vibrations present in the base 83 such as, for example, floor vibrations are not transmitted into the reference frame 89 via the dynamic isolators 95. The drive units 21, 31 as a result have a positioning accuracy which is not adversely affected by the mechanical vibrations present in the base 83. The function of the machine frame 85 will be explained in more detail further below.

Figure 6:
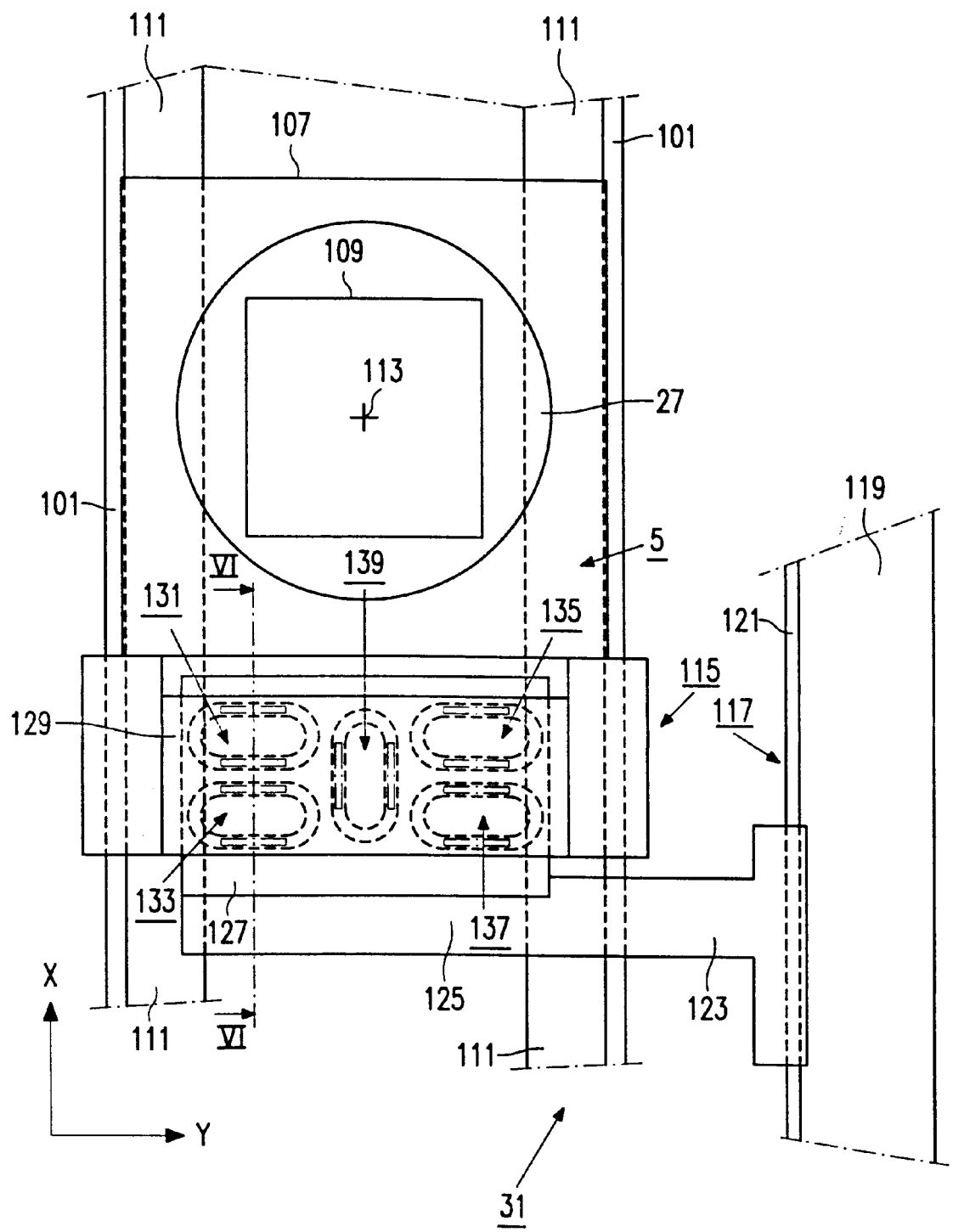
FIG. 6 is a plan view of a mask table of the lithographic device of FIG. 1.

As FIGS. 1 and 6 show, the mask table 5 comprises a block 107 on which said support surface 27 is present. The support member 101 for the mask table 5 belonging to the reference frame 89 comprises a central light passage opening 109 visible in FIG. 6 and two plane guides 111 which extend parallel to the X-direction and which lie in a common plane which is perpendicular to the Z-direction. The block 107 of the mask table 5 is guided over the plane guides 111 of the support member 101 by means of an aerostatic bearing (not visible in the Figures) with freedoms of movement parallel to the X-direction and parallel to the Y-direction, and a freedom of rotation about an axis of rotation 113 of the mask table 5 which is directed parallel to the Z-direction.

As FIGS. 1 and 6 further show, the further drive unit 31 by which the mask table 5 is displaceable comprises a first linear motor 115 and a second linear motor 117. The second linear motor 117, which is of a kind usual and known per se, comprises a stationary part 119 which is fastened to the column 87 of the machine frame 85. The stationary part 119 of the further drive unit 31 comprises a guide 121 which extends parallel to the X-direction and along which a movable part 123 of the second linear motor 117 is displaceable. The movable part 123 comprises a connection arm 125 which extends parallel to the Y-direction and to which an electric coil holder 127 of the first linear motor 115 is fastened. A permanent-magnet holder 129 of the first linear motor 115 is fastened to the block 107 of the mask table 5. The first linear motor 115 is of a kind known from EP-B-0 421 527 and comprises a first X-motor 131, a second X-motor 133, a third X-motor 135, a fourth X-motor 137, and a Y-motor 139, as shown in FIG. 6. The mask table 5 is displaceable parallel to the X-direction and rotatable about the axis of rotation 113 by means of the X-motors 131, 133, 135 and 137, while the mask table 5 is displaceable parallel to the Y-direction by means of the Y-motor 139.

During exposure of the semiconductor substrate 19, the mask table 5 should be displaced relative to the projection system 3 parallel to the X-direction over a comparatively great distance and with a high positioning accuracy. To achieve this, the coil holder 127 of the first linear motor 115 is displaced parallel to the X-direction by means of the second linear motor 117, the mask table 5 being carried along relative to the movable part 123 of the second linear motor 117 by a suitable Lorentz force of the X-motors 131, 133, 135, 137 of the first linear motor 115, whereby a desired displacement of the mask table 5 is approximately achieved by the second linear motor 117. Said desired displacement of the mask table 5 relative to the projection system 3 is achieved in that the Lorentz force of the X-motors 131, 133, 135, 137 is controlled by means of the position control system of the lithographic device during the displacement of the mask table 5, the position of the mask table 5 relative to the projection system 3 being measured by means of the laser interferometers 77, 79 and 81 of the laser interferometer system 41 cooperating with the position control system. During the exposure of the semiconductor substrate 19, the first linear motor 115 not only controls the displacement of the mask table 5 parallel to the X-direction, but it also controls a position of the mask table 5 parallel to the Y-direction and an angle of rotation of the mask table 5 about the axis of rotation 113. Since the mask table 5 can also be positioned parallel to the Y-direction and rotated about the axis of rotation 113 by the first linear motor 115, the displacement of the mask table 5 has a parallelism relative to the X-direction which is determined by the positioning accuracy of the first linear motor 115. Deviations from parallelism of the guide 121 of the second linear motor 117 relative to the X-direction can thus be compensated through displacements of the mask table 5 parallel to the Y-direction. Since the desired displacement of the mask table 5 need be achieved approximately only by the second linear motor 117, and no particularly high requirements are imposed on the parallelism of the guide 121 relative to the X-direction, a comparatively simple, conventional, one-dimensional linear motor can be used as the second linear motor 117, by means of which the mask table 5 is displaceable over comparatively large distances with a comparatively low accuracy. The desired accuracy of the displacement of the mask table 5 is achieved in that the mask table 5 is displaced over comparatively small distances relative to the movable part 123 of the second linear motor 117 by means of the first linear motor 115. The first linear motor 115 is of comparatively small dimensions because the distances over which the mask table 5 is displaced relative to the movable part 123 of the second linear motor 117 are only small. Electrical resistance losses in the electric coils of the first linear motor 115 are minimized thereby.

As was noted above, the stationary part 119 of the second linear motor 117 is fastened to the machine frame 85 of the lithographic device. It is achieved thereby that a reaction force exerted by the movable part 123 of the second linear motor 117 on the stationary part 119 and arising from a driving force of the second linear motor 117 exerted on the movable part 123 is transmitted into the machine frame 85. Since furthermore the coil holder 127 of the first linear motor 115 is fastened to the movable part 123 of the second linear motor 117, a reaction force exerted by the mask table 5 on the movable part 123 and arising from a Lorentz force of the first linear motor 115 exerted on the mask table 5 is also transmitted into the machine frame 85 via the movable part 123 and the stationary part 119 of the second linear motor 117. A reaction force exerted during operation by the mask table 5 on the further drive unit 31 and arising from a driving force exerted on the mask table 5 by the further drive unit 31 is thus introduced exclusively into the machine frame 85. Said reaction force has a low-frequency component resulting from the comparatively great displacements of the second linear motor 117 as well as a high-frequency component resulting from the comparatively small displacements carried out by the first linear motor 115 in order to achieve the desired positioning accuracy. Since the machine frame 85 is comparatively stiff and is placed on a solid base 83, the mechanical vibrations caused by the low-frequency component of the reaction force in the machine frame 85 are negligibly small. The high-frequency component of the reaction force does have a small value, but it usually has a frequency which is comparable to a resonance frequency characteristic of a type of frame such as the machine frame 85 used. As a result, the high-frequency component of the reaction force causes a non-negligible high-frequency mechanical vibration in the machine frame 85. The machine frame 85 is dynamically isolated from the reference frame 89, i.e. mechanical vibrations having a frequency above a certain threshold value, for example 10 Hz, present in the machine frame 85 are not transmitted into the reference frame 89, because the latter is coupled to the machine frame 85 exclusively via the low-frequency dynamic isolators 95. It is achieved thereby that the high-frequency mechanical vibrations caused in the machine frame 85 by the reaction forces of the further drive unit 31 are not transmitted into the reference frame 89, similar to the floor vibrations mentioned above. Since the plane guides 111 of the support member 101 extend perpendicularly to the Z-direction, and the driving forces exerted by the further drive unit 31 on the mask table 5 are also directed perpendicularly to the Z-direction, said driving forces are directed substantially parallel to the guides 111. Since the mask table 5 is guided over the guides 111 by means of an aerostatic bearing provided in the block 107, substantially no mechanical friction is present between the guides 111 and the block 107. As a result, the driving forces of the further drive unit 31 directed parallel to the guides 111 are purely used for accelerating or decelerating the mask table 5, and no reaction forces arising from said driving forces are exerted directly by the mask table 5 on the guides 111 and the reference frame 89. Furthermore, the mechanical vibrations present in the machine frame 85 cannot be transmitted into the reference frame 89 through the stationary part 119 and the movable part 123 of the second linear motor 117 either because, as is apparent from the above, the mask table 5 is coupled to the movable part 123 of the second linear motor 117 substantially exclusively by Lorentz forces of the magnet system and the electric coil system of the first linear motor 115, and the mask table 5 is physically decoupled from the movable part 123 of the second linear motor 117, apart from said Lorentz forces. So the above discussion shows that the reference frame 89 remains substantially free from mechanical vibrations and deformations caused by the driving forces and reaction forces of the further drive unit 31. The advantages thereof will be further discussed below.

Figure 4:
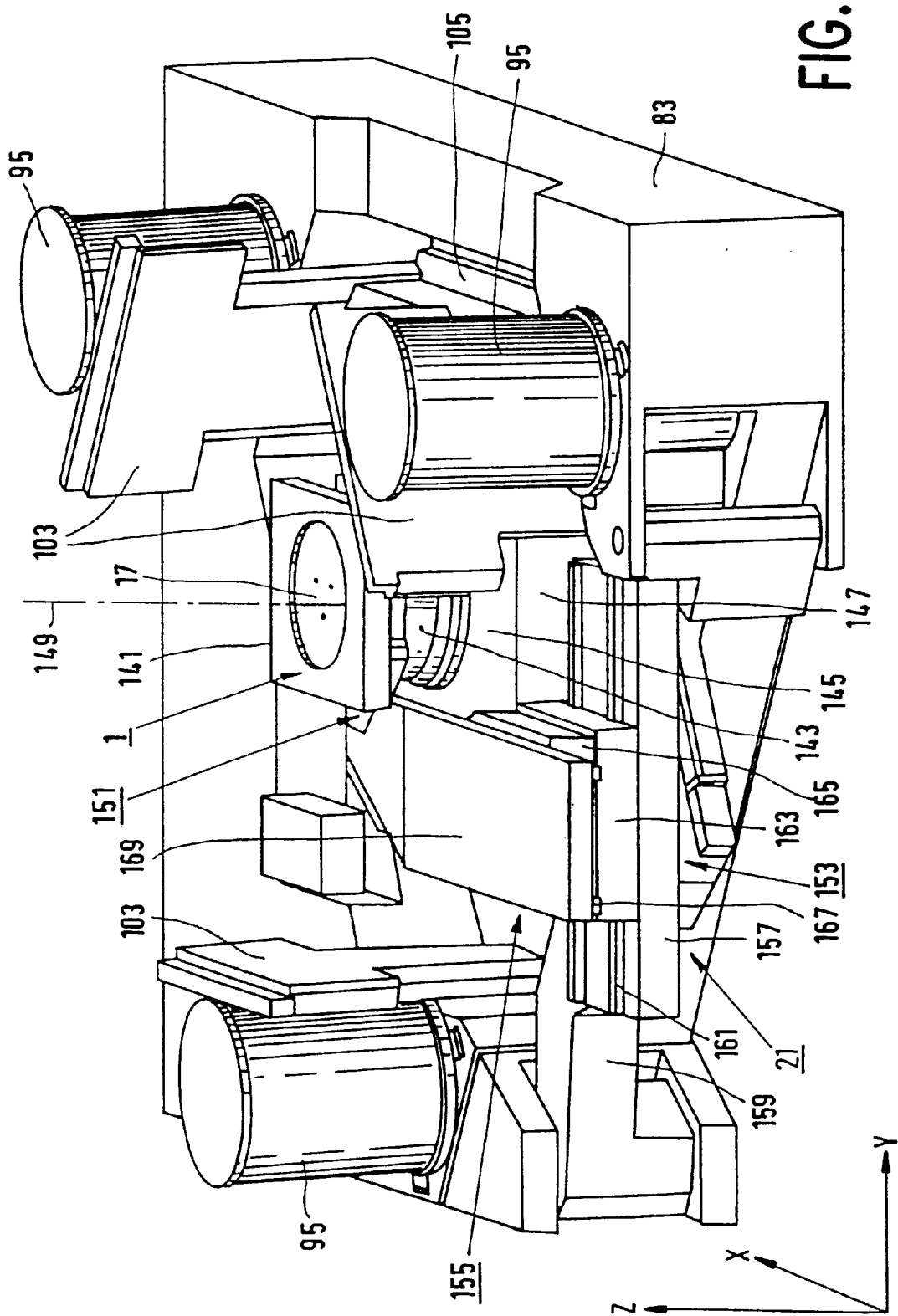
FIG. 4 shows a base and a substrate table of the lithographic device of FIG. 1.
Figure 5:
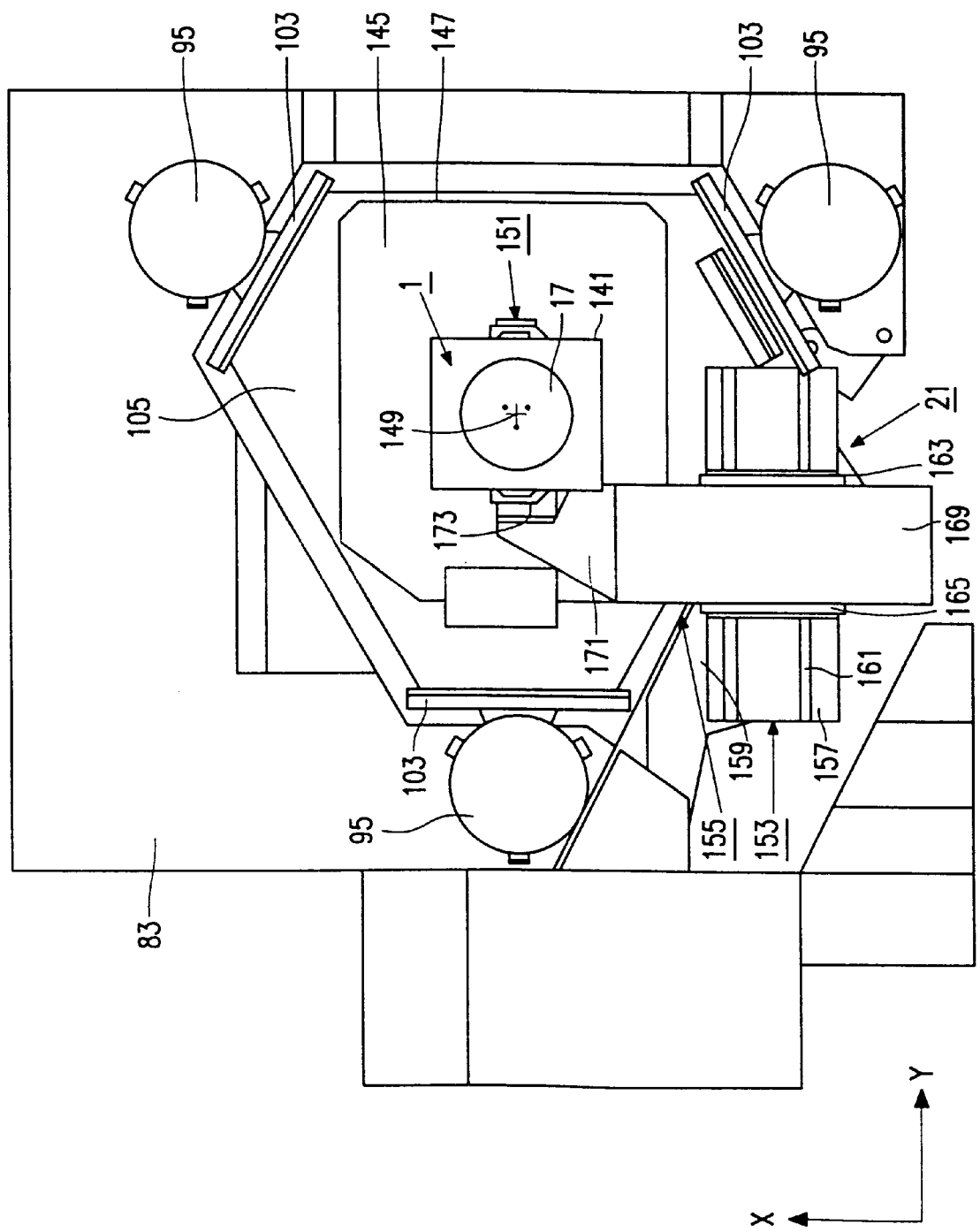
FIG. 5 is a plan view of the base and the substrate table of the lithographic device of FIG. 4.

As FIGS. 4 and 5 show, the substrate table 1 comprises a block 141 on which said support surface 17 is present, and an aerostatically supported foot 143 which is provided with an aerostatic bearing. The substrate table 1 is guided by means of the aerostatically supported foot 143 over a plane guide formed by an upper surface 145 of a granite support 147, said upper surface 145 extending perpendicularly to the Z-direction and said granite support 147 being provided on the support plate 105 of the reference frame 89. The substrate table 1 has freedoms of displacement parallel to the X-direction and parallel to the Y-direction, and a freedom of rotation about an axis of rotation 149 of the substrate table 1 which is directed parallel to the Z-direction.

As FIGS. 1, 4 and 5 further show, the drive unit 21 of the substrate table 1 comprises a first linear motor 151, a second linear motor 153, and a third linear motor 155. The second linear motor 153 and the third linear motor 155 of the drive unit 21 are of a kind identical to the second linear motor 117 of the further drive unit 31. The second linear motor 153 comprises a stationary part 157 fastened on an arm 159 which is fastened to the base 83 belonging to the machine frame 85. The stationary part 157 comprises a guide 161 which extends parallel to the Y-direction and along which a movable part 163 of the second linear motor 153 is displaceable. A stationary part 165 of the third linear motor 155 is arranged on the movable part 163 of the second linear motor 153 and is provided with a guide 167 which extends parallel to the X-direction and along which a movable part 169 of the third linear motor 155 is displaceable. As is visible in FIG. 5, the movable part 169 of the third linear motor 155 comprises a coupling piece 171 to which an electric coil holder 173 of the first linear motor 151 is fastened. The first linear motor 151 of the drive unit 21 is, as is the first linear motor 115 of the further drive unit 31, of a kind known from EP-B-0 421 527. Since the first linear motor 115 of the further drive unit 31 has been described above in detail, a detailed description of the first linear motor 151 of the drive unit 21 is omitted here. It is sufficient to note that the substrate table 1 is coupled to the movable part 169 of the third linear motor 155 exclusively by a Lorentz force perpendicular to the Z-direction during operation. A difference between the first linear motor 151 of the drive unit 21 and the first linear motor 115 of the further drive unit 31 is, however, that the first linear motor 151 of the drive unit 21 comprises X-motors and Y-motors of comparable power ratings, whereas the single Y-motor 139 of the first linear motor 115 of the further drive unit 31 has a power rating which is relatively low compared with power ratings of the X-motors 131, 133, 135, 137. This means that the substrate table 1 can not only be taken along by the first linear motor 151 parallel to the X-direction over comparatively large distances, but also parallel to the Y-direction. Furthermore, the substrate table 1 is rotatable about the axis of rotation 149 by means of the first linear motor 151.

During exposure of the semiconductor substrate 19, the substrate table 1 should be displaced relative to the projection system 3 parallel to the X-direction with a high positioning accuracy, while the substrate table 1 is to be displaced parallel to the X-direction and/or the Y-direction when a next field 35 of the semiconductor substrate 19 is brought into position relative to the projection system 3 for exposure. To displace the substrate table 1 parallel to the X-direction, the coil holder 173 of the first linear motor 151 is displaced parallel to the X-direction by means of the third linear motor 155, the substrate table 1 being taken along by a suitable Lorentz force of the first linear motor 151 relative to the movable part 169 of the third linear motor 155, whereby a desired displacement of the substrate table 1 is approximately achieved by the third linear motor 155. In a similar manner, a desired displacement of the substrate table 1 parallel to the Y-direction is approximated in that the coil holder 173 is displaced parallel to the Y-direction by means of the second linear motor 153, the substrate table 1 being taken along by a suitable Lorentz force of the first linear motor 151 relative to the movable part 169 of the third linear motor 155. Said desired displacement of the substrate table 1 parallel to the X-direction or Y-direction is achieved by means of the Lorentz force of the first linear motor 151 which is controlled during the displacement of the substrate table 1 by means of the position control system of the lithographic device referred to above, the position of the substrate table 1 relative to the projection system 3 being measured by means of the laser interferometers 57, 59 and 61 of the laser interferometer system 41 cooperating with the position control system. Since the desired displacement of the substrate table 1 need be achieved by approximation only by the second linear motor 153 and the third linear motor 155, and accordingly no particularly high requirements are imposed on the positioning accuracy of the second and third linear motors 153, 155, the second linear motor 153 and the third linear motor 155 are, as is the second linear motor 117 of the further drive unit 31, comparatively simple, conventional, one-dimensional linear motors by means of which the substrate table 1 is displaceable with a comparatively low accuracy over comparatively large distances parallel to the Y-direction and X-direction, respectively. The desired accuracy of the displacement of the substrate table 1 is achieved in that the substrate table 1 is displaced by the first linear motor 151 over comparatively small distances relative to the movable part 169 of the third linear motor 155.

Since the drive unit 21 of the substrate table 1 is of a kind similar to the further drive unit 31 of the mask table 5, and the stationary part 157 of the second linear motor 153 of the drive unit 21 is fastened to the machine frame 85 of the lithographic device, as is the stationary part 119 of the second linear motor 117 of the further drive unit 31, it is achieved that a reaction force exerted by the substrate table 1 on the drive unit 21 during operation and arising from a driving force exerted by the drive unit 21 on the substrate table 1 is exclusively transmitted into the machine frame 85. This achieves that the reaction forces of the drive unit 21 as well as the reaction forces of the further drive unit 31 cause mechanical vibrations in the machine frame 85, which are not transmitted into the reference frame 89. Since the upper surface 145 of the granite support 147 over which the substrate table 1 is guided extends perpendicularly to the Z-direction, and the driving forces exerted by the drive unit 21 on the substrate table 1 are also directed perpendicularly to the Z-direction, said driving forces are directed substantially parallel to the upper surface 145. Since the substrate table 1 is guided over the upper surface 145 by means of the aerostatically supported foot 143, substantially no mechanical friction is present between the upper surface 145 and the foot 143. As a result, the driving forces of the drive unit 21 directed parallel to the upper surface 145 are purely used for accelerating or decelerating the substrate table 1, and no reaction forces arising from said driving forces are exerted directly by the substrate table 1 on the upper surface 145 and the reference frame 89.

As mentioned before, the substrate table 1 carrying the semiconductor substrate 19 and the mask table 5 carrying the mask 29 should be synchronously displaced relative to the projection system 3 during exposure of the semiconductor substrate 19 with an accuracy which is in the sub-micron range. To obtain such a positioning accuracy, the positions of the substrate table 1 and mask table 5 relative to the projection system 3 should be measured by the measuring system 39 during exposure of the semiconductor substrate 19 with an accuracy which is in the sub-micron range, or even in the nanometer range. As mentioned before, the position of the substrate table 1 relative to the projection system 3 is measured by means of the stationary parts 51, 53, 55 and the movable parts 43, 45 of the measuring system 39, while the position of the mask table 5 relative to the projection system 3 is measured by means of the further stationary parts 71, 73, 75 and the further movable parts 63, 65 of the measuring system 39. As shown diagrammatically in FIG. 3, the stationary parts 51, 53, 55 and the further stationary parts 71, 73, 75 of the measuring system 39 are fastened to the reference frame 89 of the lithographic device which is dynamically isolated from the machine frame 85 by means of the dynamic isolators 95. As mentioned before and shown diagrammatically in FIG. 3, the projection system 3 of the lithographic device is also fastened to the reference frame 89. As discussed before, mechanical vibrations caused in the machine frame 85 by the reaction forces of the drive unit 21 and the further drive unit 31 as well as floor vibrations are not transmitted into the reference frame 89, so that the reference frame 89 remains free from mechanical vibrations caused by said reaction forces and floor vibrations. Since the stationary parts 51, 53, 55 and the further stationary parts 71, 73, 75 of the measuring system 39 and the projection system 3 are fastened to the reference frame 89, the stationary parts 51, 53, 55 and the further stationary parts 71, 73, 75 have precisely defined reference positions relative to the projection system 3 which are not adversely affected by deformations of the reference frame 89 caused by mechanical vibrations in the reference frame 89. In this way, the accuracy of the measuring system 39 comprising the laser interferometer system 41, which accuracy is sufficient per se for obtaining the required positioning accuracy of the substrate table 1 and mask table 5 mentioned above, is not adversely affected by inaccuracies of the reference positions of the stationary parts 51, 53, 55 and the further stationary parts 71, 73, 75 of the laser interferometer system 41 relative to the projection system 3, which inaccuracies may arise as a result of deformations of the reference frame 89 caused by mechanical vibrations in the reference frame 89. Since the guides 111 over which the mask table 5 is guided and the upper surface 145 over which the substrate table 1 is guided are also fastened to the reference frame 89, the guides 111 and the upper surface 145 also remain free from mechanical vibrations caused by floor vibrations and by the reaction forces of the drive unit 21 and the further drive unit 31. In this manner, the positioning accuracy of the substrate table 1 and the mask table 5 and the time required for achieving said positioning accuracy are further improved.

Figure 7:
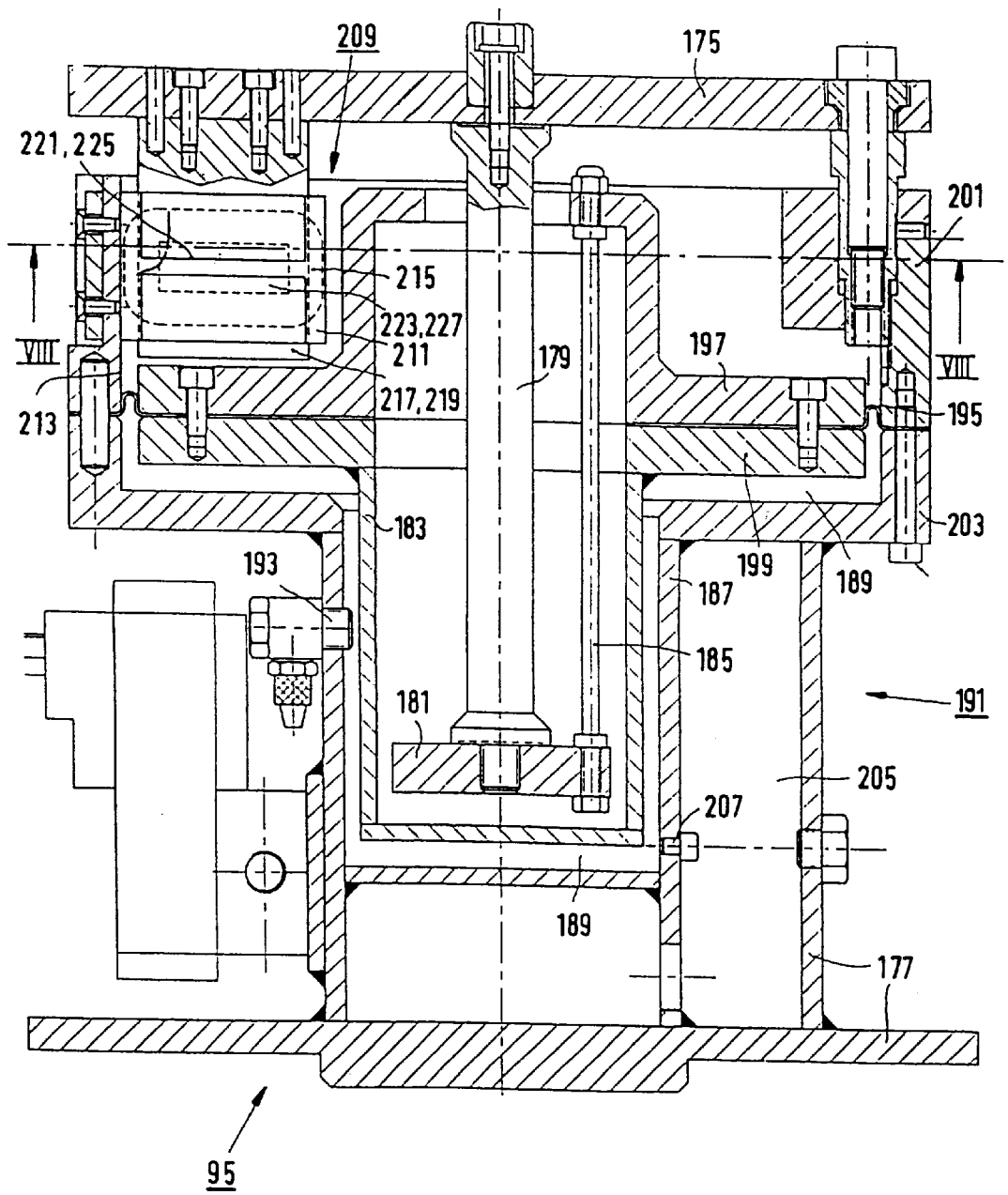
FIG. 7 is a cross-section of a dynamic isolator of the lithographic device of FIG. 1.
Figure 8:
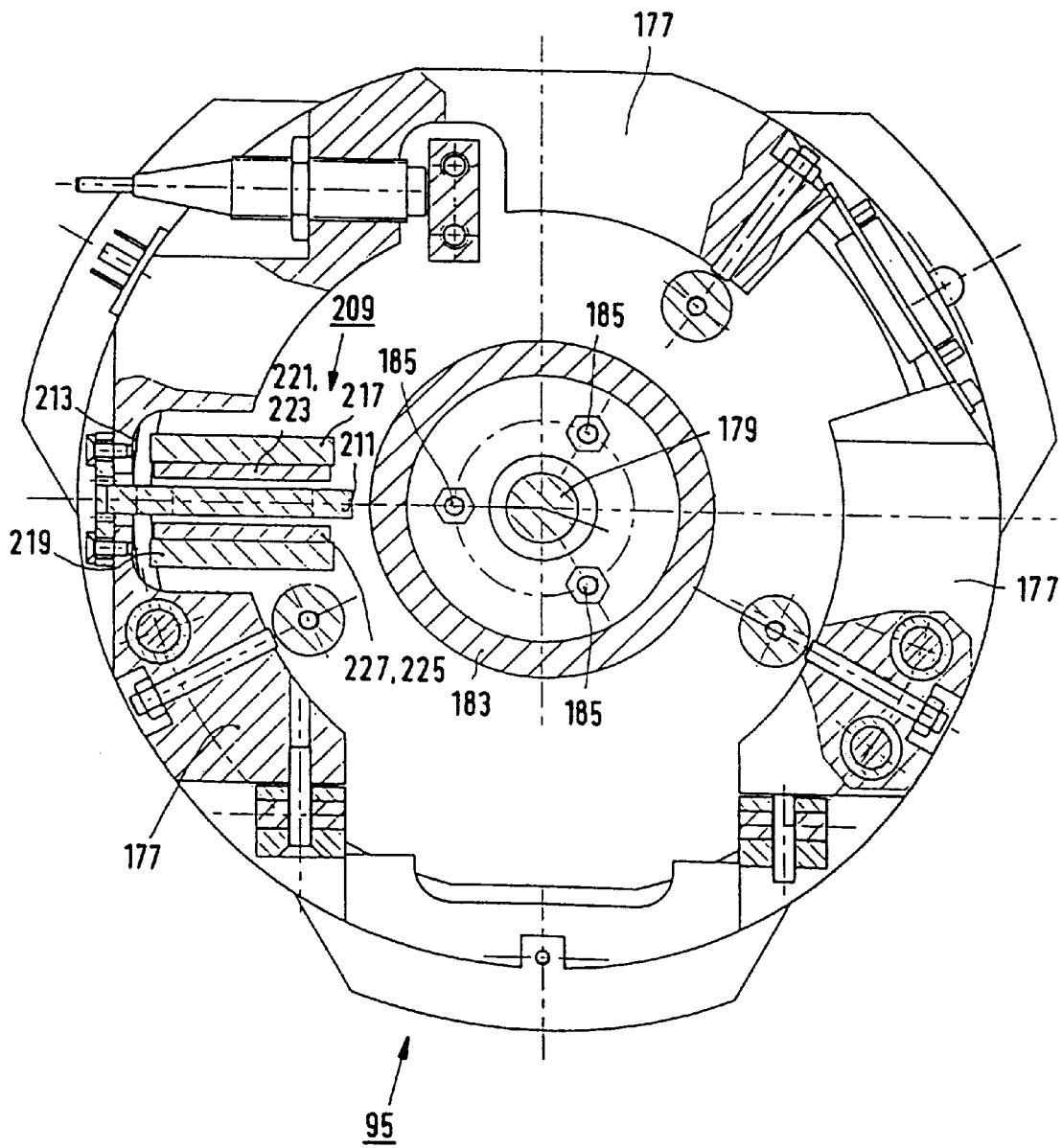
FIG. 8 is a cross-section taken on the line VIII—VIII in FIG. 7, FIG. 9 diagrammatically shows a force actuator system of the lithographic device of FIG. 1, and FIGS. 10a to 10d diagrammatically show alternative frame structures of a lithographic device according to the invention.

FIGS. 7 and 8 show one of the three dynamic isolators 95 in cross-section. The dynamic isolator 95 shown comprises a mounting plate 175 to which the corner portion 93 of the main plate 91 of the reference frame 89 resting on the dynamic isolator 95 is fastened. The dynamic isolator 95 further comprises a housing 177 which is fastened on the base 83 of the machine frame 85. The mounting plate 175 is connected via a coupling rod 179 directed parallel to the Z-direction to an intermediate plate 181 which is suspended in a cylindrical tub 183 by means of three parallel tension rods 185. Only one tension rod 185 is visible in FIG. 7, while all three tension rods 185 are visible in FIG. 8. The cylindrical tub 183 is positioned concentrically in a cylindrical chamber 187 of the housing 177. A space 189 present between the cylindrical tub 183 and the cylindrical chamber 187 forms part of a pneumatic spring 191 and is filled with compressed air through a feed valve 193. The space 189 is sealed by means of an annular, flexible rubber membrane 195 which is fastened between a first part 197 and a second part 199 of the cylindrical tub 183 and between a first part 201 and a second part 203 of the housing 177. The reference frame 89 and the components of the lithographic device supported by the reference frame 89 are thus supported in a direction parallel to the Z-direction by the compressed air in the spaces 189 of the three dynamic isolators 95, the cylindrical tub 183 and accordingly also the reference frame 89 having a certain freedom of movement relative to the cylindrical chamber 187 as a result of the flexibility of the membrane 195. The pneumatic spring 191 has a stiffness such that a mass spring system formed by the pneumatic springs 191 of the three dynamic isolators 95 and by the reference frame 89 and the components of the lithographic device supported by the reference frame 89 has a comparatively low resonance frequency such as, for example, 3 Hz. The reference frame 89 is dynamically isolated thereby from the machine frame 85 as regards mechanical vibrations having a frequency above a certain threshold value such as, for example, the 10 Hz mentioned earlier. As FIG. 7 shows, the space 189 is connected to a side chamber 205 of the pneumatic spring 191 via a narrow passage 207. The narrow passage 207 acts as a damper by means of which periodic movements of the cylindrical tub 183 relative to the cylindrical chamber 187 are damped.

As FIGS. 7 and 8 further show, each dynamic isolator 95 comprises a force actuator 209 which is integrated with the dynamic isolator 95. The force actuator 209 comprises an electric coil holder 211 which is fastened to an inner wall 213 of the housing 177. As FIG. 7 shows, the coil holder 211 comprises an electric coil 215 which extends perpendicularly to the Z-direction and is indicated in the Figure with a broken line. The coil holder 211 is arranged between two magnetic yokes 217 and 219 which are fastened to the mounting plate 175. Furthermore, a pair of permanent magnets (221, 223), (225, 227) is fastened to each yoke 217, 219, the magnets (221, 223), (225, 227) of a pair being magnetized in opposite directions each time perpendicular to the plane of the electric coil 215. When an electric current is passed through the coil 215, the coil 215 and the magnets (221, 223, 225, 227) mutually exert a Lorentz force directed parallel to the Z-direction. The value of said Lorentz force is controlled by an electric controller of the lithographic device (not shown) in a manner which will be explained in more detail further below.

Figure 9:
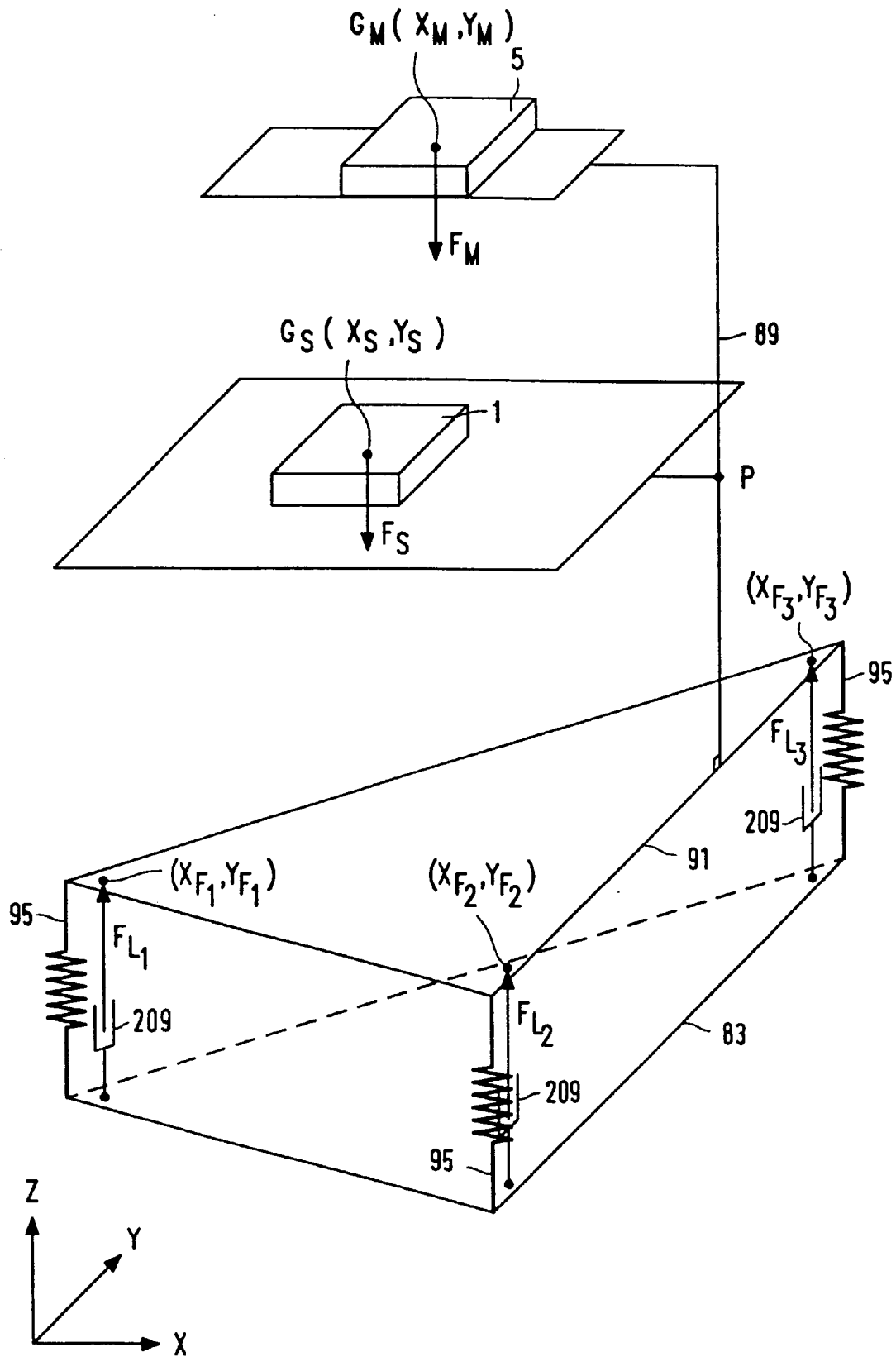

The force actuators 209 integrated with the dynamic isolators 95 form a force actuator system which is diagrammatically pictured in FIG. 9. FIG. 9 further diagrammatically shows the reference frame 89 and the substrate table 1 and mask table 5 which are displaceable relative to the reference frame 89, as well as the base 83 and the three dynamic isolators 95. FIG. 9 further shows a reference point P of the reference frame 89 relative to which a centre of gravity $G_S$ of the substrate table 1 has an X-position $X_S$ and a Y-position $Y_S$, and a centre of gravity $G_M$ of the mask table 5 has an X-position $X_M$ and a Y-position $Y_M$. It is noted that said centres of gravity $G_S$ and $G_M$ denote the centre of gravity of the total displaceable mass of the substrate table 1 with the semiconductor substrate 19 and that of the mask table 5 with the mask 29, respectively. As FIG. 9 further shows, the Lorentz forces $F_{L,1}$, $F_{L,2}$ and $F_{L,3}$ of the three force actuators 209 have points of application on the reference frame 89 with an X-position $X_{F,1}$, $X_{F,2}$ and $X_{F,3}$ and a Y-position $Y_{F,1}$, $Y_{F,2}$ and $Y_{F,3}$ relative to the reference point P. Since the reference frame 89 supports the substrate table 1 and the mask table 5 parallel to the vertical Z-direction, the substrate table 1 and the mask table 5 exert a support force $F_S$ and a support force $F_M$, respectively, on the reference frame 89 having a value corresponding to a value of a force of gravity acting on the substrate table 1 and the mask table 5. The support forces $F_S$ and $F_M$ have points of application relative to the reference frame 89 with an X-position and Y-position corresponding to the X-position and Y-position of the centres of gravity $G_S$ and $G_M$ of the substrate table 1 and the mask table 5, respectively. If the substrate table 1 and the mask table 5 are displaced relative to the reference frame 89 during exposure of the semiconductor substrate 19, the points of application of the support forces $F_S$ and $F_M$ of the substrate table 1 and the mask table 5 are also displaced relative to the reference frame 89. Said electric controller of the lithographic device controls the value of the Lorentz forces $F_{L,1}$, $F_{L,2}$ and $F_{L,3}$ such that a sum of mechanical moments of the Lorentz forces $F_{L,1}$, $F_{L,2}$ and $F_{L,3}$ about the reference point P of the reference frame 89 has a value which is equal to and a direction which is opposed to a value and a direction, respectively, of a sum of mechanical moments of the support forces $F_S$ and $F_M$ of the substrate table 1 and the mask table 5 about the reference point P:

$$F_{L,1} + F_{L,2} + F_{L,3} = F_S + F_M$$

$$F_{L,1} * X_{F,1} + F_{L,2} * X_{F,2} + F_{L,3} * X_{F,3} = F_S * X_S + F_M * X_M$$

$$F_{L,1} * Y_{F,1} + F_{L,2} * Y_{F,2} + F_{L,3} * Y_{F,3} = F_S * Y_S + F_M * Y_M$$

The controller which controls the Lorentz forces $F_{L,1}$, $F_{L,2}$ and $F_{L,3}$ comprises, for example, a feedforward control loop which is usual and known per se, where the controller receives information on the positions $X_S$, $Y_S$ of the substrate table 1 and the positions $X_M$, $Y_M$ of the mask table 5 from the position control system of the lithographic device which controls the positions of the substrate table 1 and the mask table 5, the received information relating to the desired positions of the substrate table 1 and the mask table 5. The controller may alternatively be provided with a feedback control loop which is usual and known per se, where the controller receives information on the positions $X_S$, $Y_S$ of the substrate table 1 and the positions $X_M$, $Y_M$ of the mask table 5 from the measuring system 39 of the lithographic device, the received information relating to the measured positions of the substrate table 1 and the mask table 5. The controller may alternatively comprise a combination of said feedforward and feedback control loops. The Lorentz forces $F_{L,1}$, $F_{L,2}$ and $F_{L,3}$ of the force actuator system thus form a compensation force by means of which displacements of the centres of gravity $G_S$ and GM of the substrate table 1 and the mask table 5 relative to the reference frame 89 are compensated. Since the sum of the mechanical moments of the Lorentz forces $F_{L,1}$, $F_{L,2}$, $F_{L,3}$ and the support forces $F_S$, $F_M$ about the reference point P of the reference frame 89 has a constant value and direction, the substrate table 1 and the mask table 5 each have a so-called virtual centre of gravity which has a substantially constant position relative to the reference frame 89. It is achieved thereby that the reference frame 89 does not sense the displacements of the actual centres of gravity $G_S$ and $G_M$ of the substrate table 1 and the mask table 5 during exposure of the semiconductor substrate 19. Without the above force actuator system, a displacement of the substrate table 1 or the mask table 5 would lead to an uncompensated change in the mechanical moment of the support forces $F_S$ or $F_M$ about the reference point P, as a result of which the reference frame 89 would perform a low-frequency shaking movement on the dynamic isolators 95, or elastic deformations or mechanical vibrations could arise in the reference frame 89.

The fact that the three force actuators 209 are integrated with the three dynamic isolators 95 results in a compact and simple construction of the force actuator system and the lithographic device. The triangular arrangement of the dynamic isolators 95 in addition achieves a particularly stable operation of the force actuator system. Since the compensation force of the force actuator system comprises exclusively a Lorentz force, mechanical vibrations present in the base 83 and the machine frame 85 are not transmitted to the reference frame 89 through the force actuators 209.

The lithographic device according to the invention described before comprises a machine frame 85 supporting the stationary part 157 of the drive unit 21 and the stationary part 119 of the further drive unit 31, and a reference frame 89 supporting the stationary parts 51, 53, 55 and the further stationary parts 71, 73, 75 of the measuring system 39, the projection system 3, and the guides 111 and 145 of the mask table 5 and the substrate table 1, respectively. This frame structure of the lithographic device is shown diagrammatically in FIG. 3. It is noted that the invention also covers other frame structures with which a lithographic device can be provided. Some examples of such alternative frame structures are shown diagrammatically in FIGS. 10a to 10d and will be described hereafter.

Figure 10A:
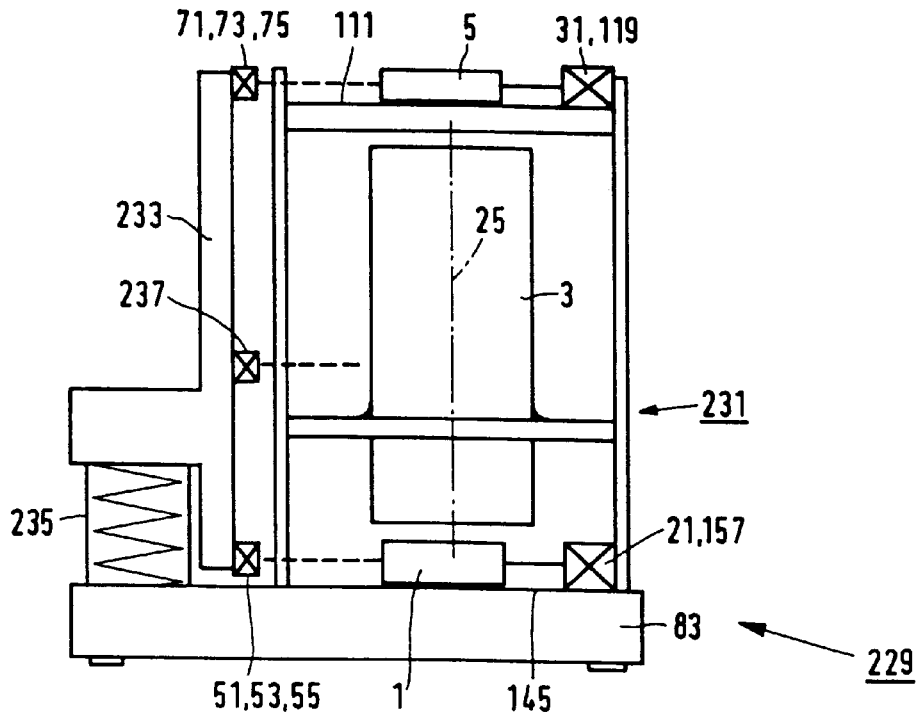

FIG. 10a diagrammatically shows a lithographic device 229 according to the invention provided with a machine frame 231 and a reference frame 233 which is dynamically isolated from the machine frame 231 by means of dynamic isolators 235. As FIG. 10a shows, the reference frame 233 only supports the stationary parts 51, 53, 55 and 71, 73, 75 of the measuring system. The machine frame 231 supports the main components of the lithographic device, such as the projection system 3, the drive units 21 and 31 and the guides 111 and 145 of the mask table 5 and the substrate table 1. In this embodiment, the measuring system measures a position of the substrate table 1 relative to the mask table 5. The measuring system of the lithographic device 229 may alternatively be provided with a further stationary part 237 which is fastened to the reference frame 233 and measures a position of the projection system 3 relative to the reference frame 233. In this manner, the measuring system can measure a position of the mask table 5 relative to the projection system 3 as well as a position of the substrate table 1 relative to the projection system 3. In this embodiment, it is not necessary to provide the reference frame 233 with a force actuator system for compensating displacements of the centres of gravity of the substrate table 1 and the mask table 5.

Figure 10B:
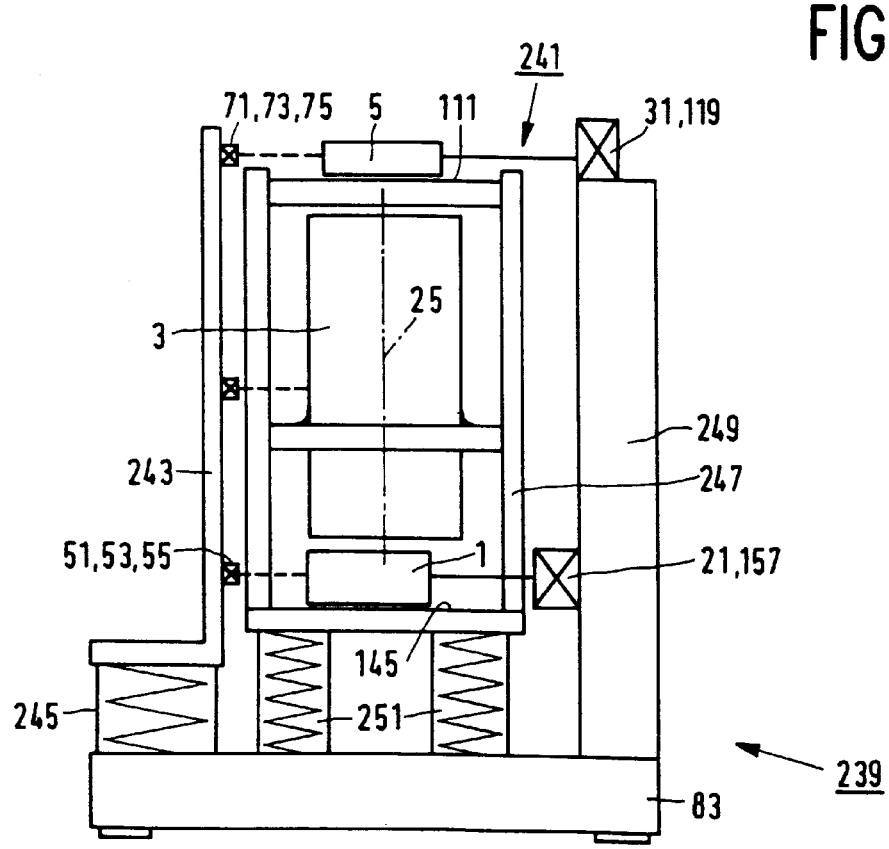

FIG. 10b diagrammatically shows a lithographic device 239 according to the invention provided with a machine frame 241 and a reference frame 243 which is dynamically isolated from the machine frame 241 by means of dynamic isolators 245. As FIG. 10b shows, the reference frame 243 only supports the stationary parts 51, 53, 55 and 71, 73, 75 of the measuring system. The machine frame 241 comprises a basic frame 247 and a so-called force frame 249 which is dynamically isolated from the basic frame 247 by means of further dynamic isolators 251. The force frame 249 supports the stationary parts 157 and 119 of the drive units 21 and 31, while the basic frame 247 carries the projection system 3 and the guides 111 and 145 of the mask table 5 and the substrate table 1, respectively. In this embodiment, the reaction forces of the drive units 21 and 31 are transmitted to the force frame 249. The reference frame 243 and the basic frame 247 both remain free from mechanical vibrations and deformations caused by said reaction forces. It is not necessary to provide the reference frame 243 with a force actuator system for compensating displacements of the centres of gravity of the substrate table 1 and the mask table 5.

Figure 10C:
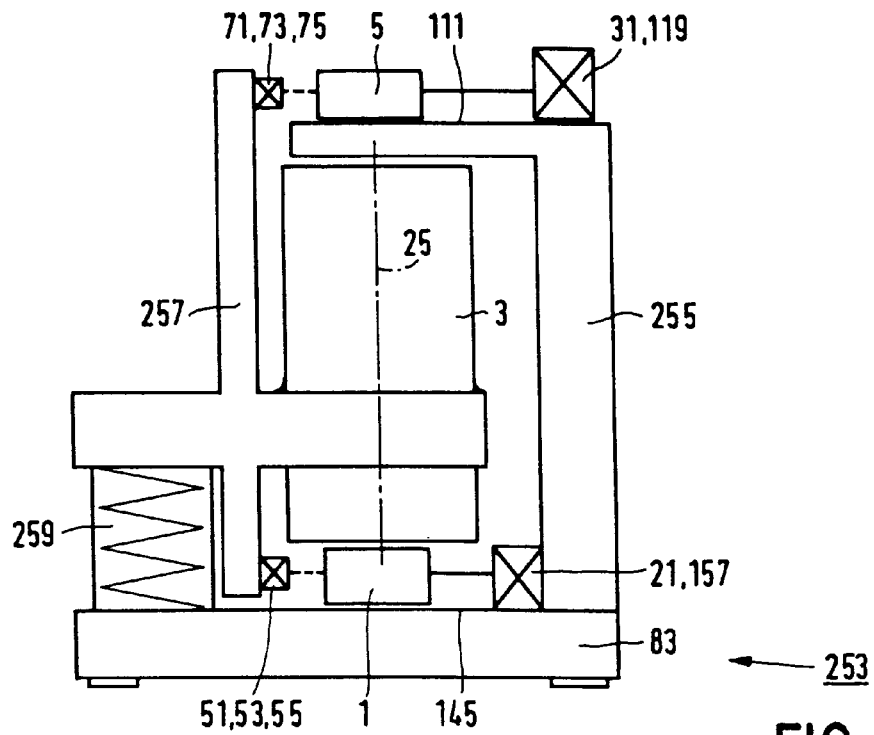

FIG. 10c diagrammatically shows a lithographic device 253 according to the invention provided with a machine frame 255 and a reference frame 257 which is dynamically isolated from the machine frame 255 by means of dynamic isolators 259. As FIG. 10c shows, the reference frame 257 carries the stationary parts 51, 53, 55 and 71, 73, 75 of the measuring system and the projection system 3. The machine frame 255 carries the drive units 21, 31 and the guides 111 and 145 of the mask table 5 and substrate table 1, respectively. In this embodiment, it is not necessary to provide the reference frame 257 with a force actuator system for compensating displacements of the centres of gravity of the substrate table 1 and the mask table 5. The stationary parts 51, 53, 55 and 71, 73, 75 of the measuring system and the projection system 3 have precisely defined mutual positions, so that the measuring system accurately measures the positions of the substrate table 1 and the mask table 5 relative to the projection system 3.

Figure 10D:
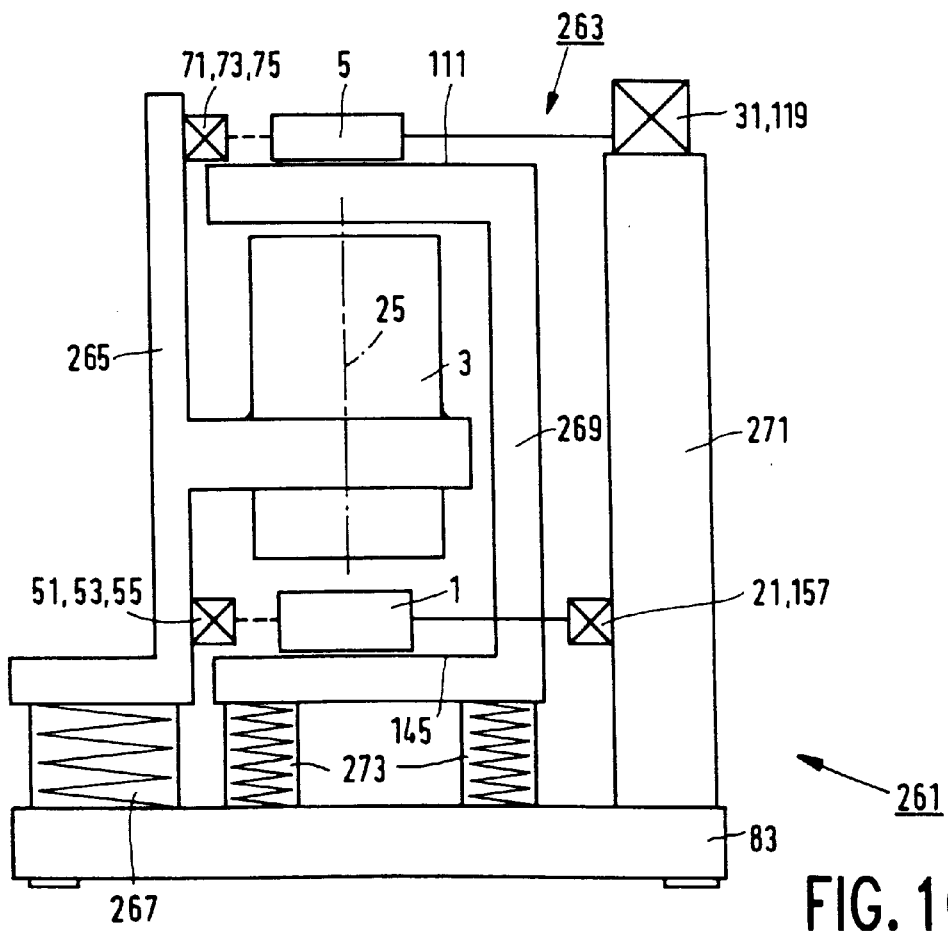

Finally, FIG. 10d diagrammatically shows a lithographic device 261 according to the invention provided with a machine frame 263 and a reference frame 265 which is dynamically isolated from the machine frame 263 by means of dynamic isolators 267. As FIG. 10d shows, the reference frame 265 supports the stationary parts 51, 53, 55 and 71, 73, 75 of the measuring system and the projection system 3. The machine frame 263 comprises a basic frame 269 and a force frame 271 which is dynamically isolated from the basic frame 269 by means of dynamic isolators 273. The basic frame 269 carries the guides 111 and 145 of the mask table 5 and the substrate table 1, respectively, while the force frame 271 carries the stationary parts 157 and 119 of the respective drive units 21 and 31. In this embodiment, the reaction forces of the drive units 21, 31 are exerted on the force frame 271, so that the basic frame 269 and the reference frame 265 both remain free from mechanical vibrations and deformations caused by said reaction forces. It is not necessary to provide the reference frame 265 with a force actuator system for compensating displacements of the centres of gravity of the substrate table 1 and the mask table 5.

The lithographic devices according to the invention described before work by the "step and scan" principle according to which the substrate table 1 and the mask table 5 are synchronously displaced relative to the projection system 3 during exposure of the semiconductor substrate 19. It is noted that the invention also covers lithographic devices which work by the "step and repeat" principle mentioned earlier and which are provided with a mask table which is stationary relative to the projection system. Such a lithographic device covered by the invention is also obtained in that the mask table 5 with the further drive unit 31 in the lithographic devices described before is replaced by a conventional mask holder which is stationary relative to the projection system 3, such as the mask holder known from, for example, EP-A-250 031. According to the invention, such a lithographic device working by the "step and repeat" principle is provided with a reference frame which carries the stationary parts of the measuring system measuring the position of the substrate table relative to the projection system. According to the invention, the reference frame of the "step and repeat" lithographic device may also support the projection system of the lithographic device or the projection system and the stationary mask holder, in which case it is not necessary to provide the reference frame with a force actuator system for compensating displacements of the substrate table. Furthermore, the reference frame of the "step and repeat" lithographic device may also support the guide along which the substrate table is guided. In the last embodiment, the reference frame can be provided with a force actuator system for compensating displacements of the centre of gravity of the substrate table relative to the reference frame. Such a force actuator system exerts a compensation force on the reference frame which has a mechanical moment about a reference point of the reference frame having a value equal to a value of a mechanical moment of a force of gravity acting on the substrate table about said reference point, and a direction which is opposed to a direction of the mechanical moment of said force of gravity.

The lithographic devices according to the invention as described before are used for exposing semiconductor substrates in the manufacture of integrated electronic semiconductor circuits. It is further noted that such a lithographic device may alternatively be used for the manufacture of other products having structures with detail dimensions in the sub-micron range, where mask patterns are imaged on a substrate by means of the lithographic device. Structures of integrated optical systems or conduction and detection patterns of magnetic domain memories, as well as structures of liquid crystal display patterns may be mentioned in this connection.

The lithographic device described before is provided with a measuring system 39 comprising a laser interferometer system 41 with three laser interferometers 57, 59, 61 for measuring an X-position, a Y-position and an angle of rotation θ of the substrate table 1, and three laser interferometers 77, 79, 81 for measuring an X-position, a Y-position and an angle of rotation θ' of the mask table 5. It is noted that the laser interferometer system 41 may also comprise a different number of laser interferometers. For example, the further drive unit 31 of the mask table 5 may be provided with a motor by means of which the mask table 5 is displaceable exclusively parallel to the X-direction, in which case the further stationary part of the measuring system 39 comprises only a single laser interferometer for measuring an X-position of the mask table 5. It is further noted that instead of a laser interferometer system the measuring system may comprise another kind of system for measuring the positions of the substrate table 1 and/or the mask table 5 such as, for example, an inductive measuring system.

The lithographic device described before comprises a positioning device comprising the substrate table 1 of the lithographic device which constitutes an object table of said positioning device, the projection system 3, the mask table 5 and the radiation source 7 of the lithographic device which together constitute a sub-system of said positioning device for exposing a semiconductor substrate 19 to be placed on the substrate table 1, the drive unit 21, the measuring system 39, the machine frame 85 and the reference frame 89. It is finally noted that the invention also covers other kinds of positioning devices comprising an object table, a sub-system for processing an object to be placed on the object table, a drive unit for displacing the object table relative to the sub-system, and a measuring system for measuring a position of the object table relative to the sub-system, wherein a stationary part of the drive unit is fastened to a machine frame and a stationary part of the measuring system is fastened to a reference frame which is dynamically isolated from the machine frame. Examples are devices for analyzing or measuring objects or materials, where an object or material is to be positioned or displaced accurately relative to a measuring system or scanning system. Another application for a positioning device according to the invention is, for example, a precision machine tool by means of which workpieces, for example lenses, can be machined with accuracies in the sub-micron range. The drive unit in the positioning device according to the invention is used in this case for positioning the workpiece relative to a rotating tool, or for positioning a tool relative to a rotating workpiece. Therefore, the term "sub-system for processing an object" mentioned in the claims and description does not only relate to machining systems by which an object can be machined, but also to, for example, measuring, scanning or exposure systems in which no mechanical or physical contact is present between the sub-system and the object to be processed.

We claim:

1. A positioning device comprising an object table, a sub-system for processing an object to be placed on the object table, a drive unit for displacing the object table relative to the sub-system, and a measuring system for measuring a position of the object table relative to the sub-system, the drive unit comprising a stationary part which is fastened to a machine frame of the positioning device, while the measuring system comprises a stationary part and a movable part which is fastened to the object table for cooperation with the stationary part of the measuring system, characterized in that the stationary part of the measuring system is fastened to a reference frame of the positioning device which is dynamically isolated from the machine frame.

2. A positioning device as claimed in claim 1, characterized in that the sub-system is fastened to the reference frame.

3. A positioning device as claimed in claim 1, characterized in that the object table is displaceable over a guide parallel to at least an X-direction, the guide being fastened to the reference frame.

4. A positioning device as claimed in claim 3, characterized in that the positioning device is provided with a force actuator system which is controlled by an electric control unit and which exerts a compensation force on the reference frame during operation, which compensation force has a mechanical moment about a reference point of the reference frame having a value equal to a value of a mechanical moment of a force of gravity acting on the object table about said reference point, and a direction which is opposed to a direction of the mechanical moment of said force of gravity.

5. A lithographic device comprising a radiation source, a mask table, a projection system having a main axis, a substrate table, a drive unit for displacing the substrate table relative to the projection system in at least one direction perpendicular to the main axis, and a measuring system for measuring a position of the substrate table relative to the projection system, the drive unit comprising a stationary part which is fastened to a machine frame of the lithographic device, while the measuring system comprises a stationary part and a movable part which is fastened to the substrate table for cooperation with the stationary part of the measuring system, characterized in that the stationary part of the measuring system is fastened to a reference frame of the lithographic device which is dynamically isolated from the machine frame.

6. A lithographic device as claimed in claim 5, characterized in that the substrate table is displaceable over a guide which extends perpendicularly to the main axis and is fastened to the reference frame.

7. A lithographic device as claimed in claim 6, characterized in that the lithographic device is provided with a force actuator system which is controlled by an electric control unit and which exerts a compensation force on the reference frame during operation, which compensation force has a mechanical moment about a reference point of the reference frame having a value equal to a value of a mechanical moment of a force of gravity acting on the substrate table about said reference point, and a direction which is opposed to a direction of the mechanical moment of said force of gravity.

8. A lithographic device as claimed in claim 5, characterized in that the lithographic device comprises a further drive unit for displacing the mask table relative to the projection system in a scanning direction perpendicular to the main axis, the further drive unit comprising a stationary part which is fastened to the machine frame, while the substrate table is displaceable relative to the projection system parallel to at least the scanning direction, the measuring system comprising a further stationary part which is fastened to the reference frame and a further movable part which is fastened to the mask table for cooperation with the further stationary part of the measuring system for measuring a position of the mask table relative to the projection system or for measuring a position of the mask table relative to the substrate table.

9. A lithographic device as claimed in claim 8, characterized in that the mask table is displaceable over a first guide extending parallel to the scanning direction and the substrate table is displaceable over a second guide extending perpendicularly to the main axis, the first guide and the second guide being fastened to the reference frame.

10. A lithographic device as claimed in claim 9, characterized in that the lithographic device is provided with a force actuator system which is controlled by an electric control unit and which exerts a compensation force on the reference frame during operation, which compensation force has a mechanical moment about a reference point of the reference frame of a value which is equal to a value of a sum of a mechanical moment of a force of gravity acting on the substrate table about said reference point and a mechanical moment of a force of gravity acting on the mask table about said reference point, and a direction which is opposed to a direction of said sum of mechanical moments.

11. A lithographic device as claimed in claim 5, characterized in that the projection system is fastened to the reference frame.

* * * * *